United States Patent
Naruse

(10) Patent No.: US 10,734,314 B2
(45) Date of Patent: Aug. 4, 2020

(54) SEMICONDUCTOR DEVICE AND SEMICONDUCTOR MODULE

(71) Applicant: AISIN AW CO., LTD., Anjo-shi, Aichi-ken (JP)

(72) Inventor: Takanobu Naruse, Nishio (JP)

(73) Assignee: AISIN AW CO., LTD., Anjo-shi, Aichi-Ken (JP)

(*) Notice: Subject to any disclaimer, the term of this patent is extended or adjusted under 35 U.S.C. 154(b) by 210 days.

(21) Appl. No.: 15/742,228

(22) PCT Filed: Aug. 31, 2016

(86) PCT No.: PCT/JP2016/075577
§ 371 (c)(1),
(2) Date: Jan. 5, 2018

(87) PCT Pub. No.: WO2017/038904
PCT Pub. Date: Mar. 9, 2017

(65) Prior Publication Data
US 2018/0204819 A1    Jul. 19, 2018

(30) Foreign Application Priority Data
Aug. 31, 2015  (JP) .................. 2015-170408

(51) Int. Cl.
*H01L 23/498* (2006.01)
*G11C 5/04* (2006.01)
(Continued)

(52) U.S. Cl.
CPC .... *H01L 23/49822* (2013.01); *G01C 21/3688* (2013.01); *G11C 5/04* (2013.01);
(Continued)

(58) Field of Classification Search
CPC ............... H01L 25/0652; H01L 23/498; H01L 23/49822; H01L 24/49; H01L 23/49838; G11C 5/04; G01C 21/3688
See application file for complete search history.

(56) References Cited

U.S. PATENT DOCUMENTS

2007/0192559 A1    8/2007  Betsui et al.
2008/0068284 A1*   3/2008  Watanabe ............... B60K 35/00
                                                         345/1.1
(Continued)

FOREIGN PATENT DOCUMENTS

JP    2011-096268 A    5/2011
JP    2012-156291 A    8/2012
(Continued)

OTHER PUBLICATIONS

Web page: R-Car H2 (Renesas Electronics America, Mar. 25, 2013), https://www.renesas.com/en-us/solutions/automotive/products/rcar-h2.html.
(Continued)

*Primary Examiner* — Zandra V Smith
*Assistant Examiner* — Abbigale A Boyle
(74) *Attorney, Agent, or Firm* — Sughrue Mion, PLLC

(57) ABSTRACT

Input and output terminals are arranged so as to be adapted for an environment in which they are to be used. A semiconductor module (5) is surface-mounted on a surface wiring layer (30a) of a main substrate (3). A first module terminal group (11) located on a module first side (2a) of the semiconductor module (5) and a first substrate terminal group (301) located on a substrate first side (3a) of the main substrate (3) are connected by a first surface wiring pattern (311) formed in a surface wiring layer (30a). A second module terminal group (12) located on a module second side (2c) and a second substrate terminal group (302) located on a substrate second side (3c) are connected by a second
(Continued)

surface wiring pattern (312) formed in the surface wiring layer (30*a*).

38 Claims, 13 Drawing Sheets

(51) Int. Cl.
  *G01C 21/36* (2006.01)
  *H01L 25/18* (2006.01)
  *H01L 25/065* (2006.01)
  *H01L 23/00* (2006.01)
  *H01L 25/04* (2014.01)

(52) U.S. Cl.
  CPC ............ *H01L 23/498* (2013.01); *H01L 24/49* (2013.01); *H01L 25/04* (2013.01); *H01L 25/0652* (2013.01); *H01L 25/18* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01)

(56) References Cited

U.S. PATENT DOCUMENTS

| | | | |
|---|---|---|---|
| 2008/0151484 | A1 | 6/2008 | Suzuki et al. |
| 2012/0187564 | A1* | 7/2012 | Tsuge ................ H01L 23/49822 257/773 |
| 2015/0137363 | A1 | 5/2015 | Ozawa et al. |
| 2015/0162070 | A1 | 6/2015 | Sato |

FOREIGN PATENT DOCUMENTS

| | | |
|---|---|---|
| JP | 2015-099890 A | 5/2015 |
| JP | 2015-111360 A | 6/2015 |
| WO | 2015/079551 A1 | 6/2015 |

OTHER PUBLICATIONS

International Search Report for PCT/JP2016/075577 dated Oct. 18, 2016.

Communication dated Jul. 9, 2018 from the European Patent Office in counterpart Application No. 16841934.9.

\* cited by examiner

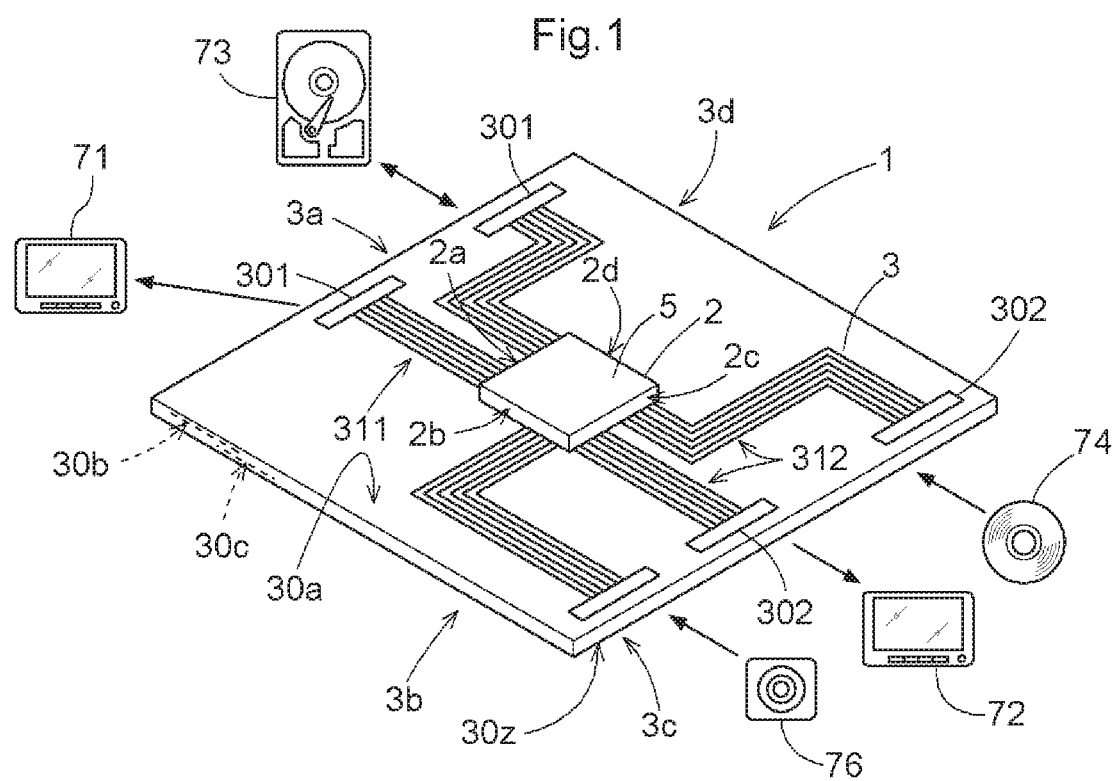
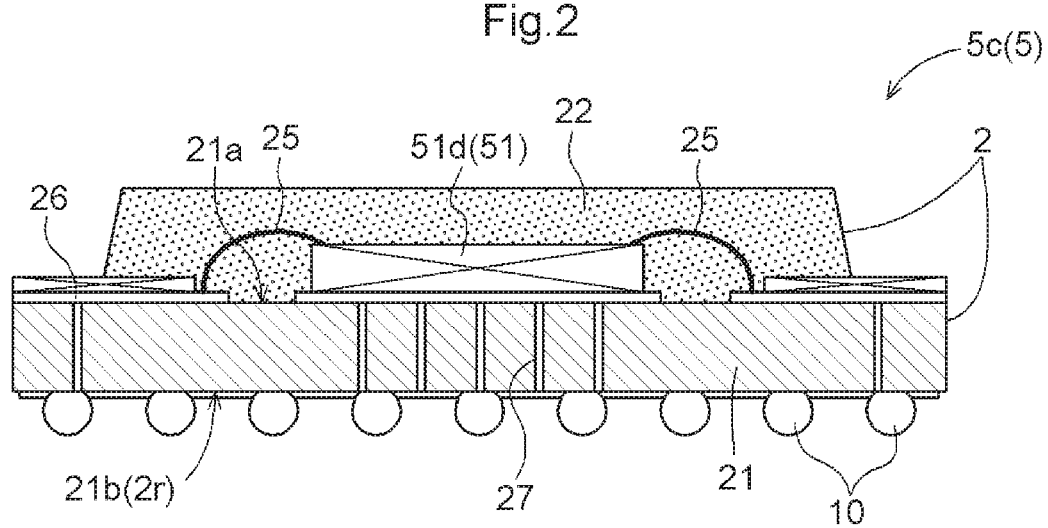

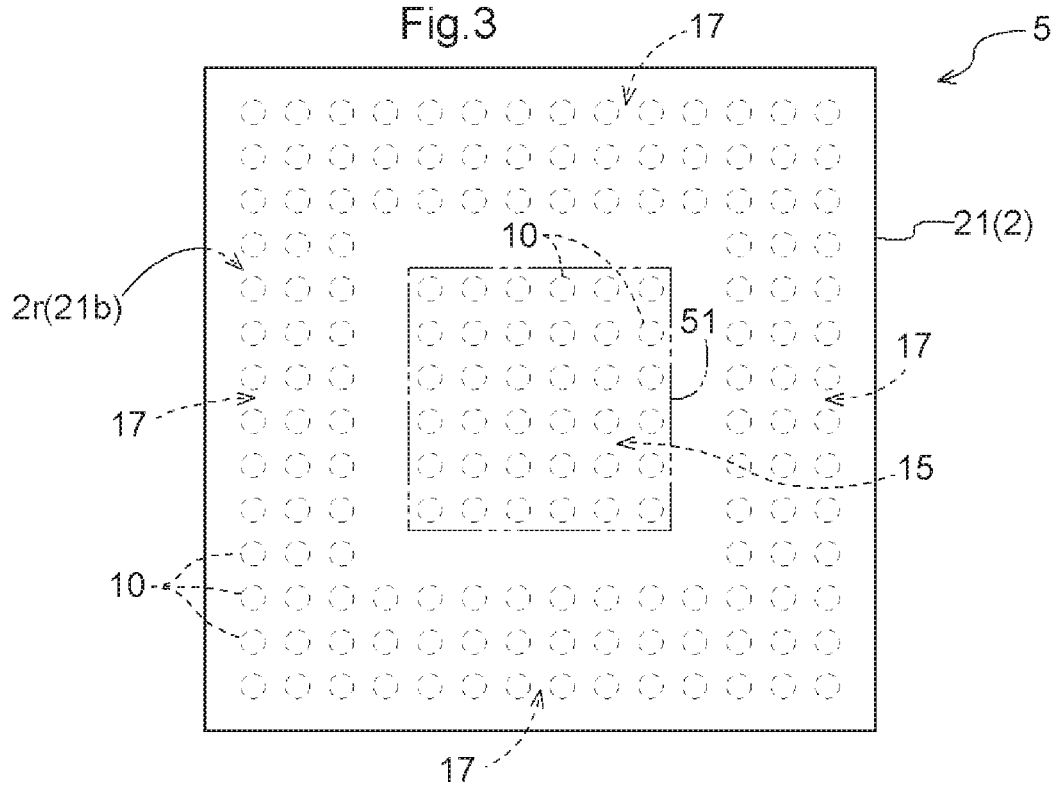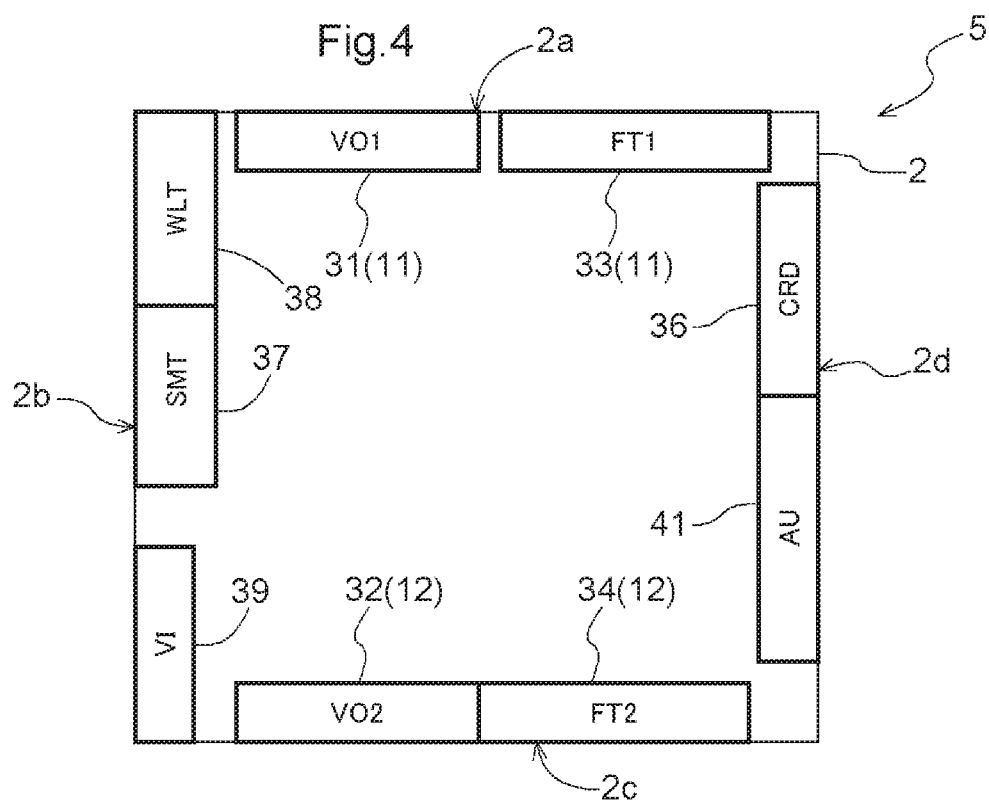

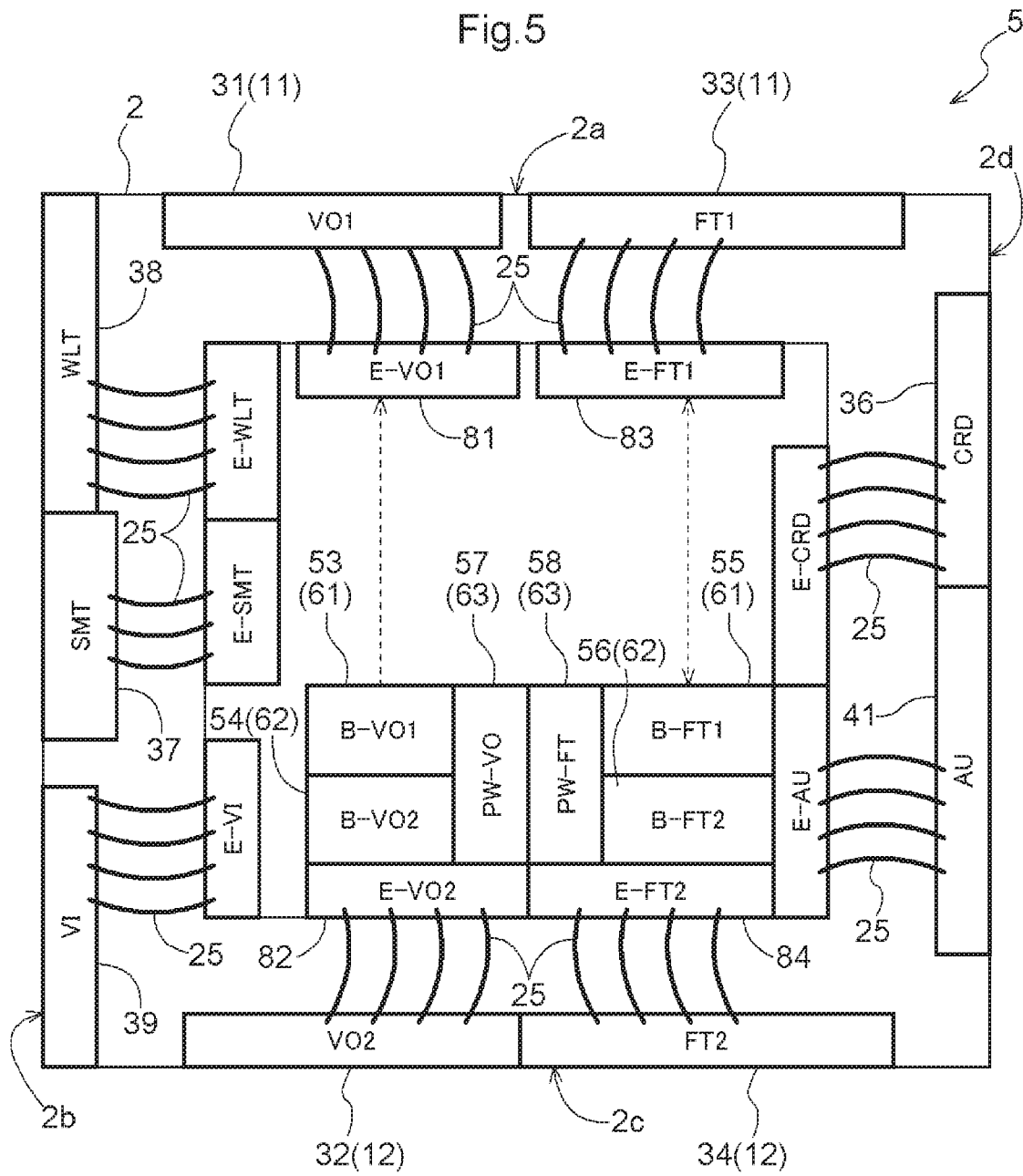

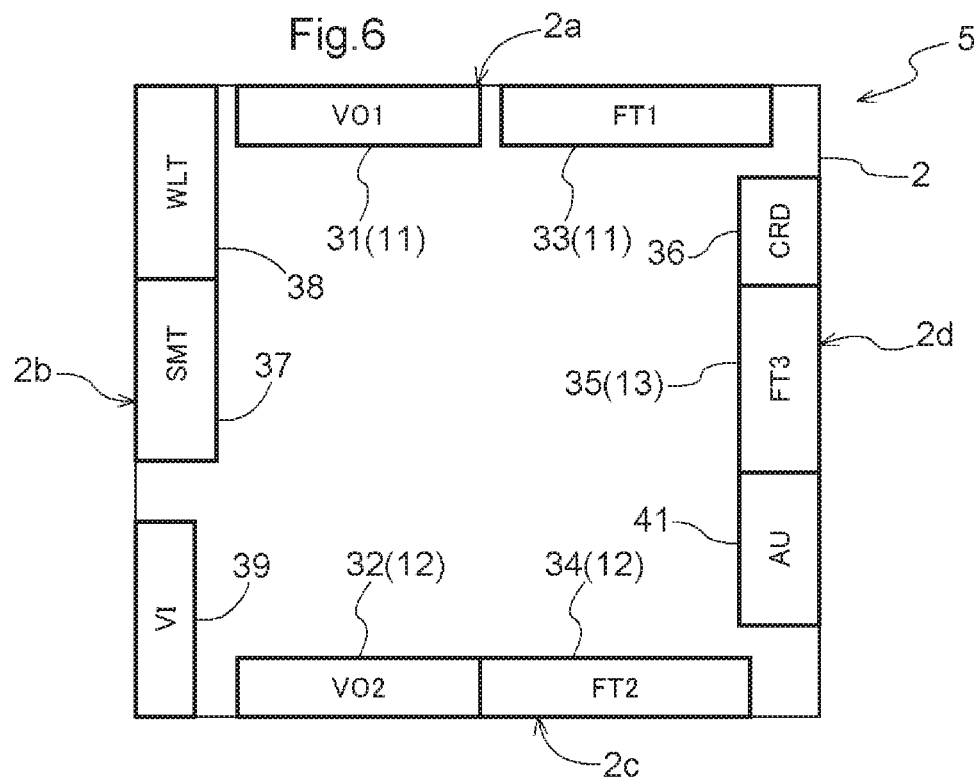
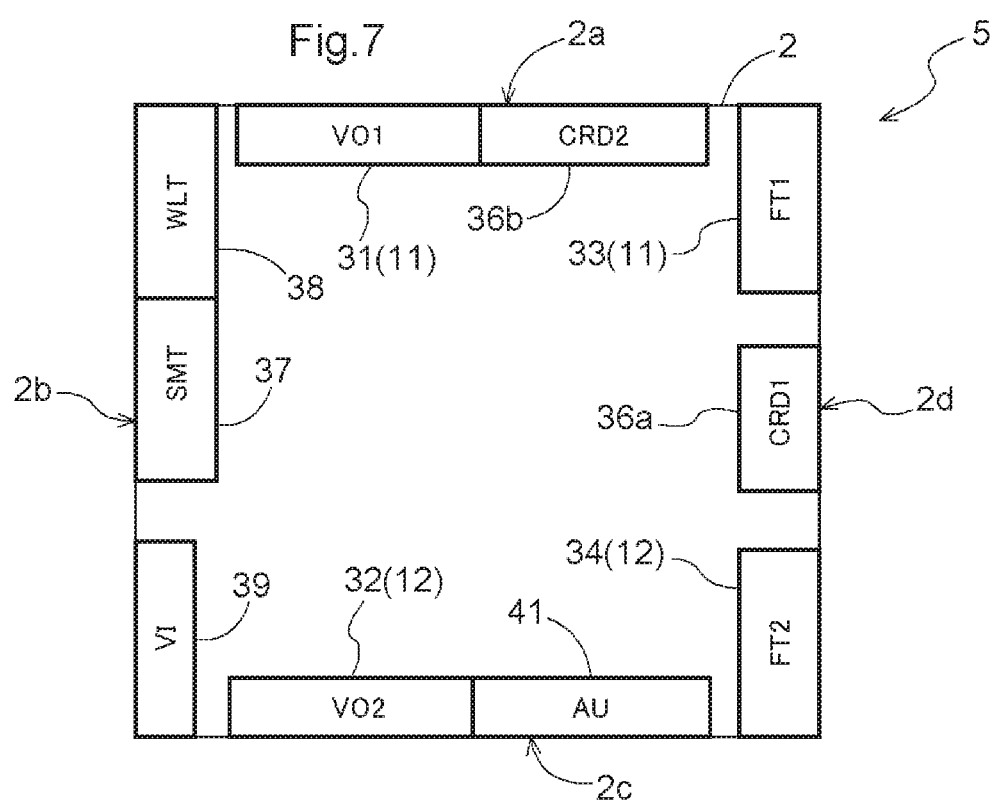

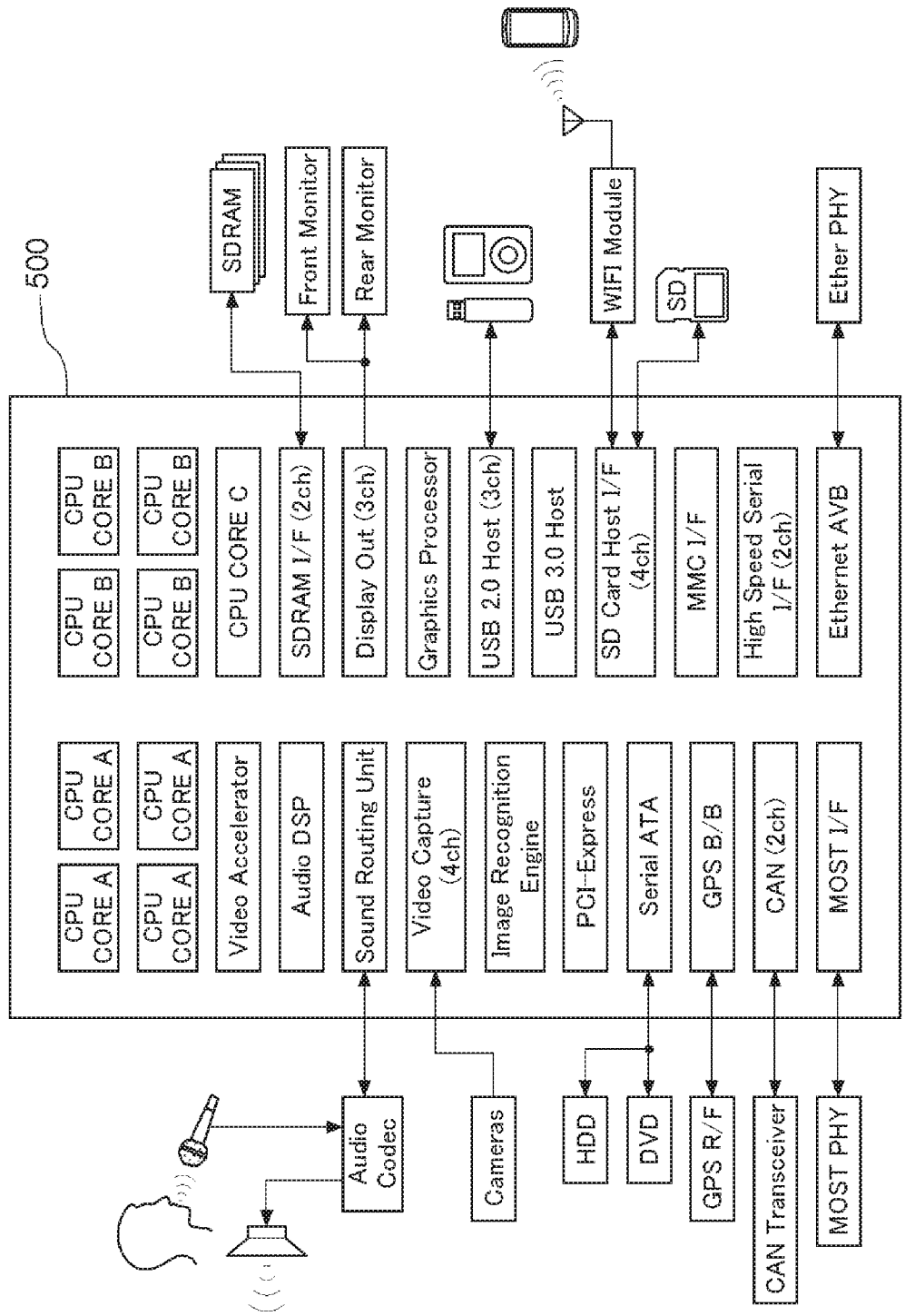

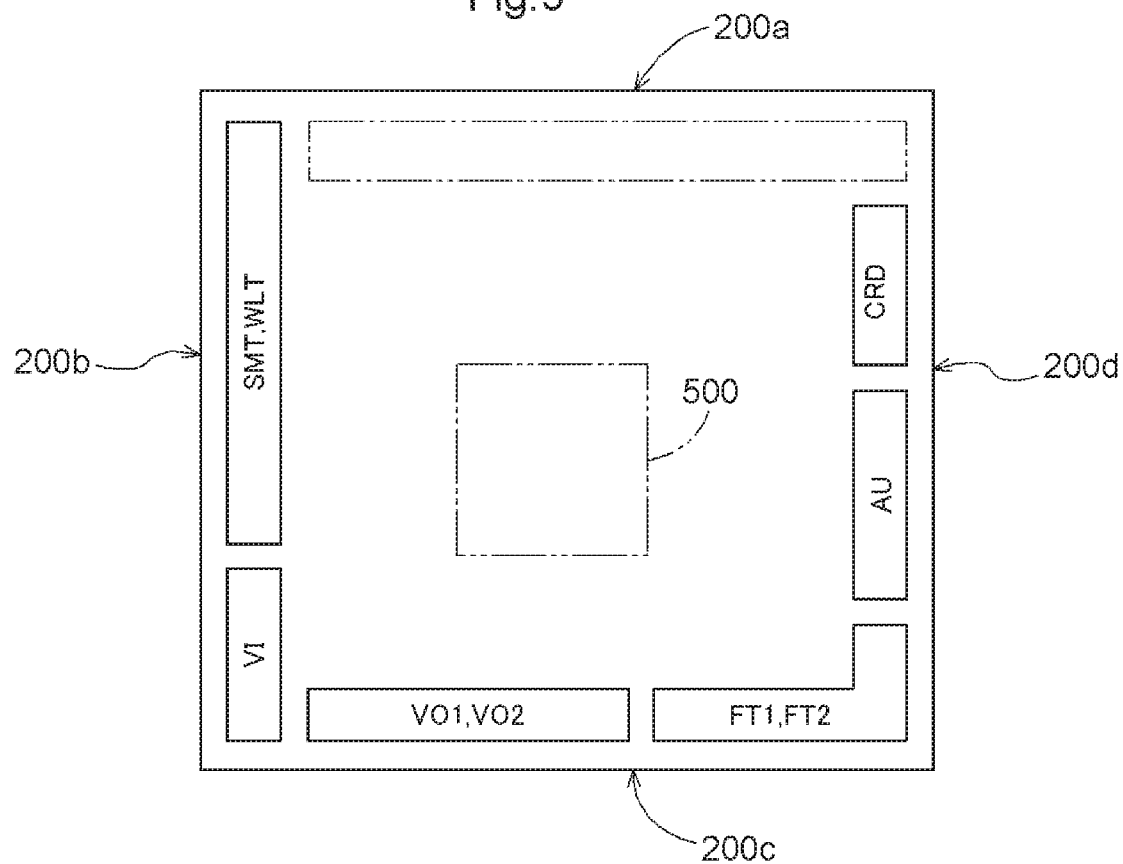
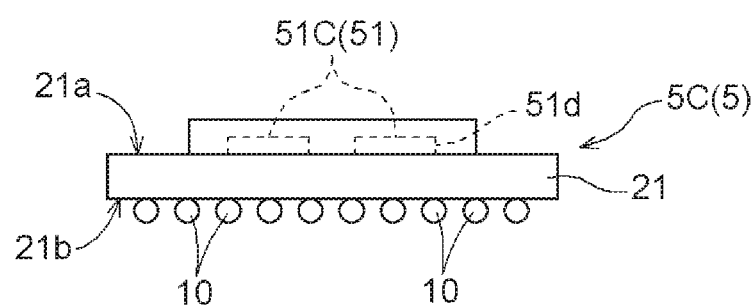

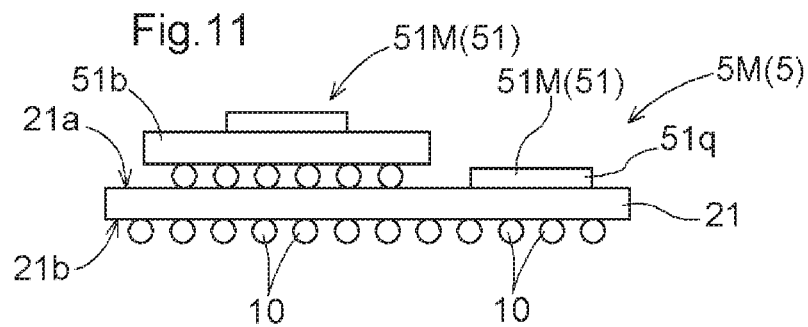
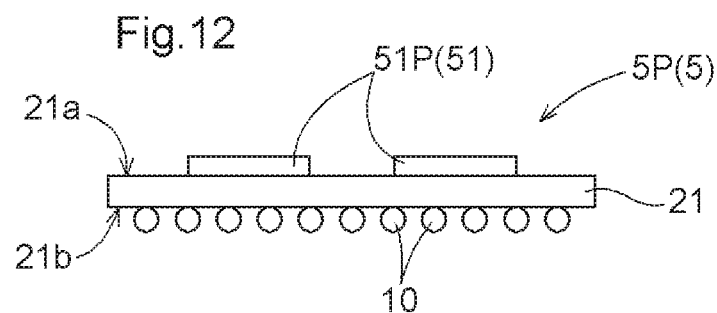
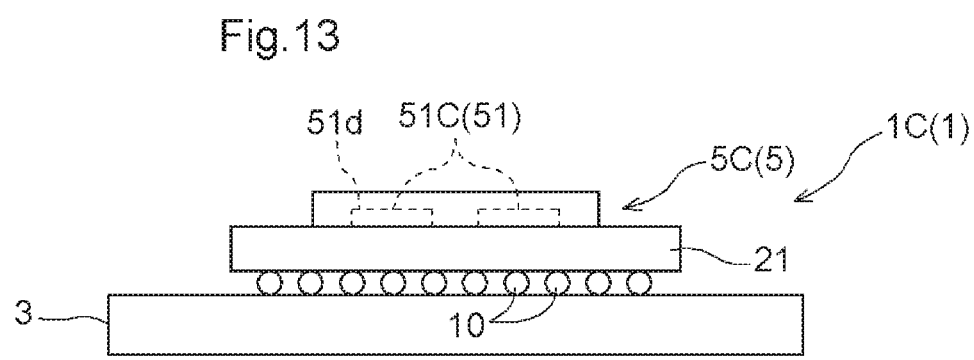
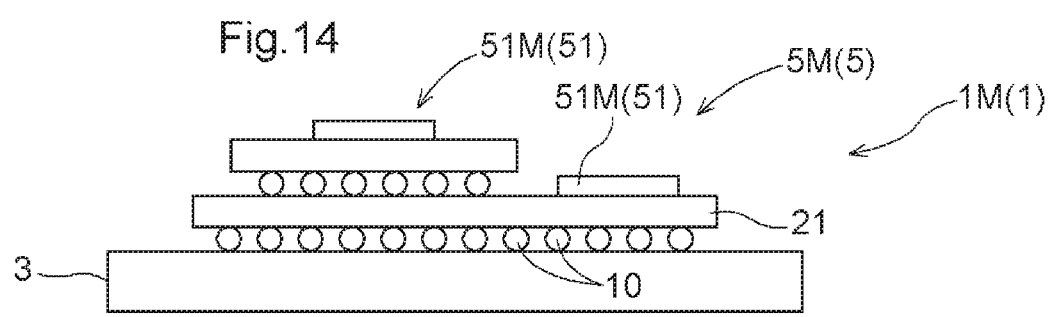

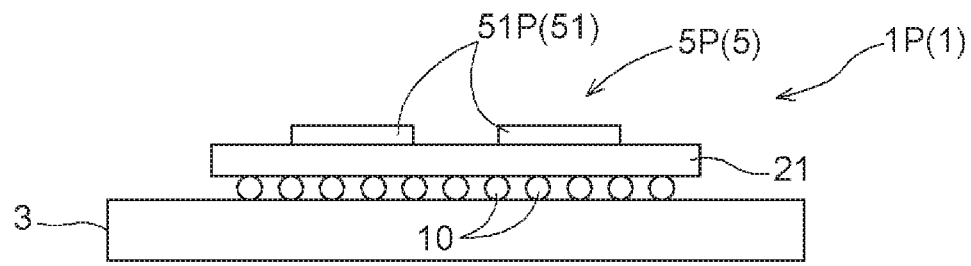
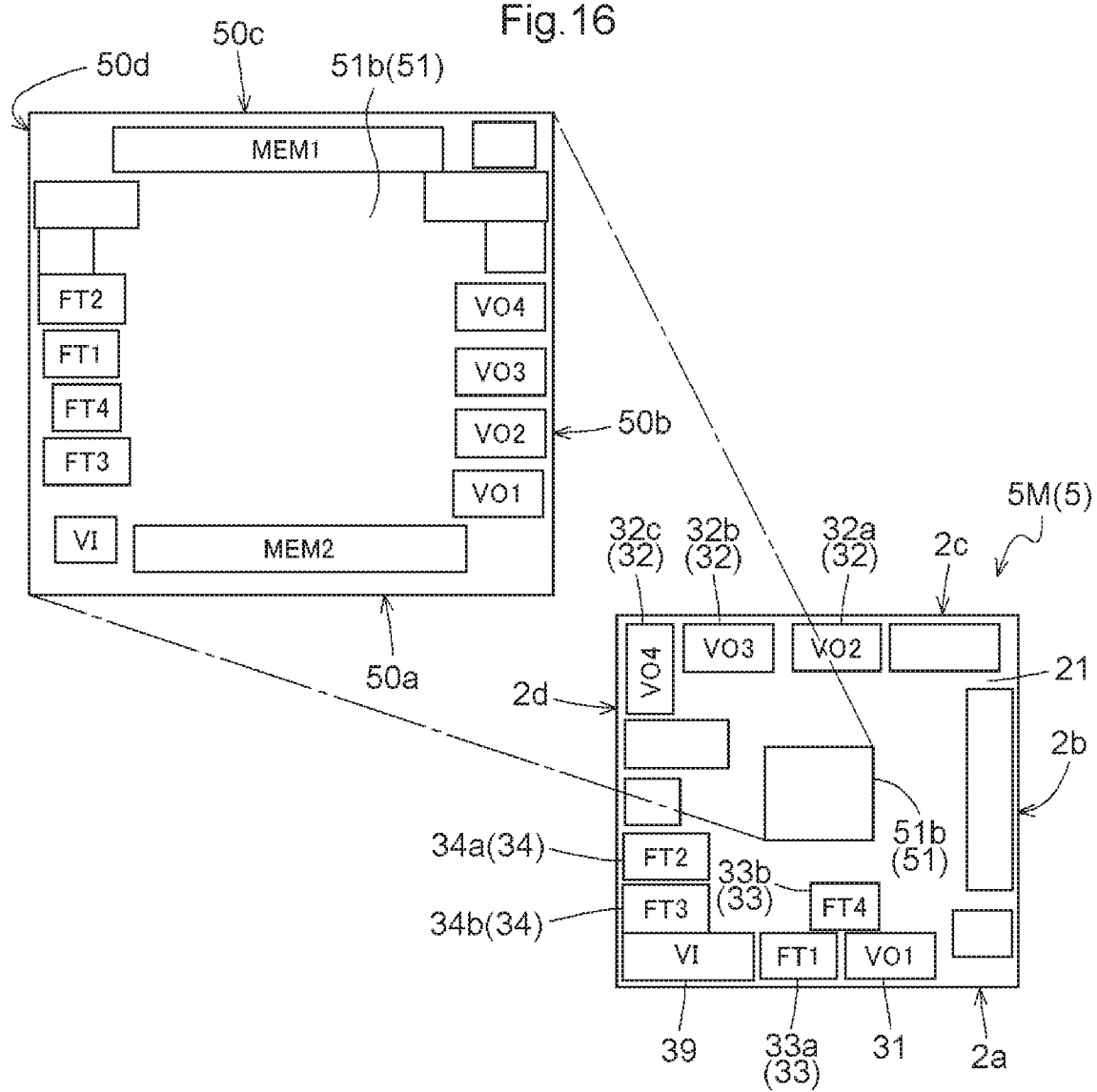

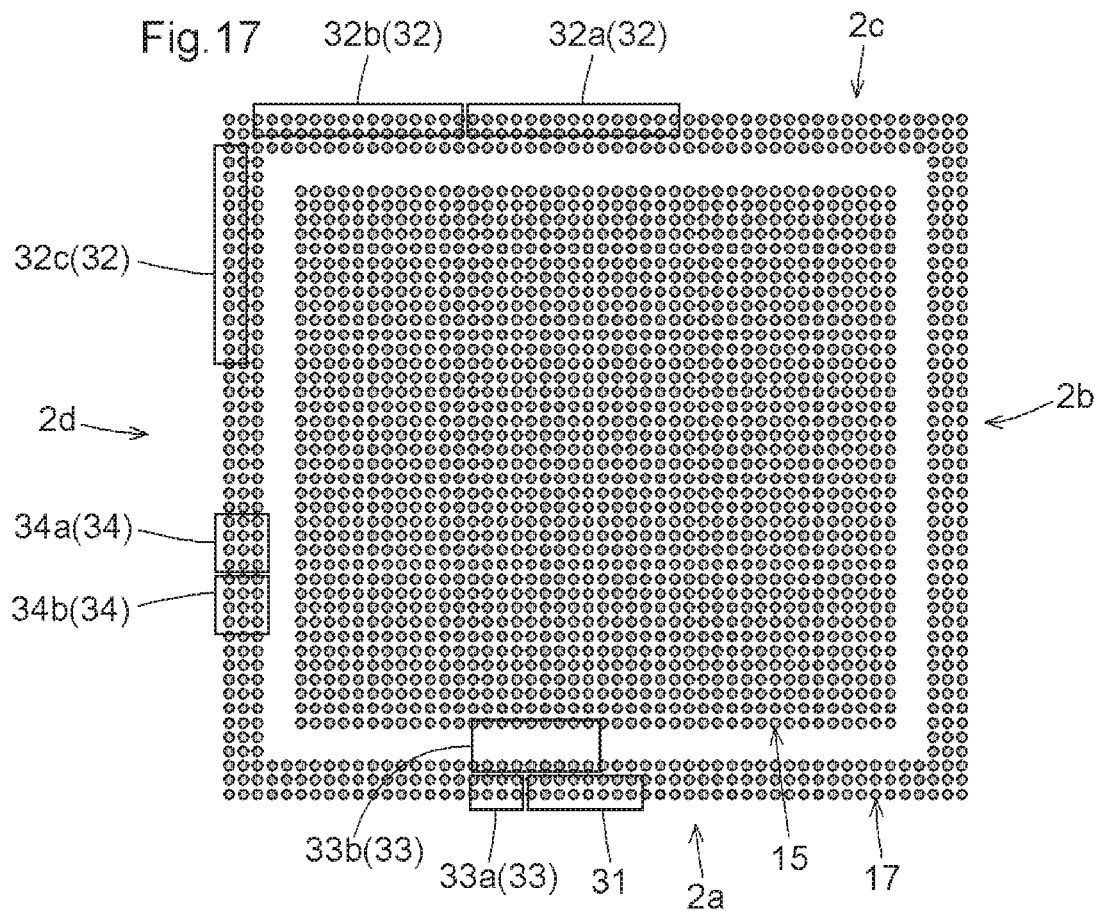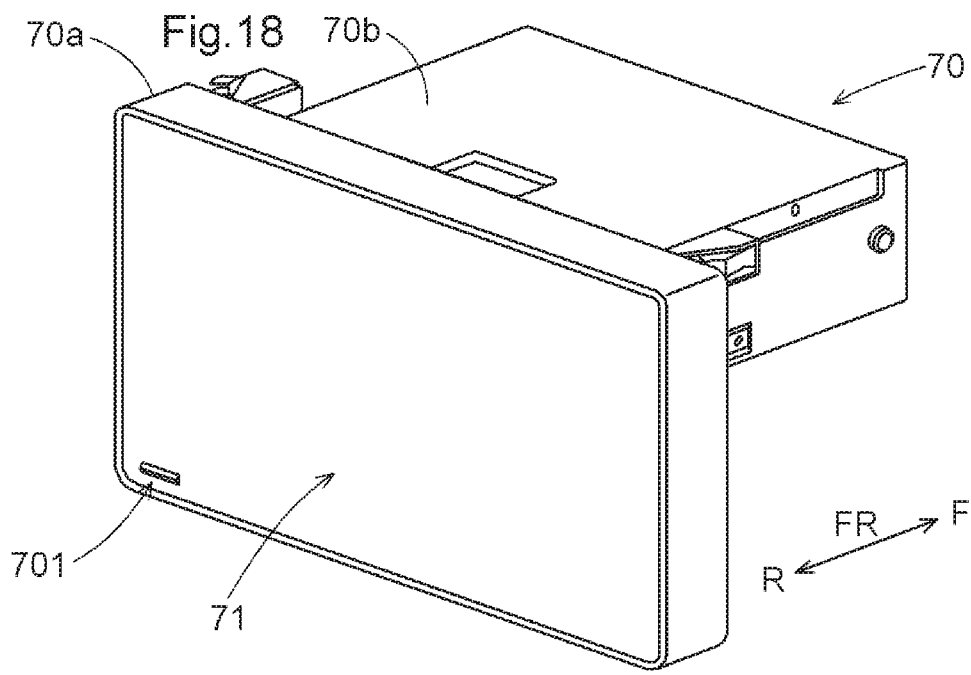

US 10,734,314 B2

SEMICONDUCTOR DEVICE AND SEMICONDUCTOR MODULE

CROSS REFERENCE TO RELATED APPLICATIONS

This application is a National Stage of International Application No. PCT/JP2016/075577 filed Aug. 31, 2016, claiming priority based on Japanese Patent Application No. 2015-170408 filed Aug. 31, 2015, the contents of all of which are incorporated herein by reference in their entirety.

TECHNICAL FIELD

The present application relates to semiconductor devices including a circuit board having a plurality of wiring layers and through holes and a semiconductor module, and semiconductor modules.

BACKGROUND ART

Semiconductor modules such as a system LSI (also called a system on a chip (SOC)) that is a large scale integration circuit (LSI) having integrated on a single semiconductor element a plurality of circuit blocks (mega cells) having specific functions and a multichip module (MCM) that is a module of a plurality of semiconductor elements having specific functions have been put into practical use. Japanese Patent Application Publication No. 2011-96268 (JP 2011-96268 A) (Patent Document 1) discloses a technique that implements ease of wiring design on a motherboard and a module substrate of a semiconductor module when configuring a circuit board (motherboard) having such a semiconductor module mounted thereon. Patent Document 1 discloses optimization of power supply to a memory that is mounted on a semiconductor module (multichip module), etc. (Patent Document 1: FIG. 8, [0045] to [0047], etc.).

Such multichip modules have a processor such as a microcomputer mounted thereon in addition to the memory. Mega cells and input and output terminals in a system LSI are usually arranged close to each other so that the wiring distance on a semiconductor element is short. FIG. 9 schematically shows an example of arrangement of the input and output terminals in the system LSI. In the case where two image output terminals are provided like "VO1, VO2" in FIG. 9, these two image output terminals are placed close to each other. However, there are some cases where these two image output terminals need be extended in different directions, depending on the position where a device using image output signals is placed. With recent improvement in image quality, image signals have been increasingly becoming fast. In order to appropriately obtain signals while dealing with high-speed signals, the number of layers in a circuit board such as a motherboard having a plurality of wiring layers or the area of the circuit board need be increased in some cases. Long wiring increases radiation noise, which may affect other circuits. Moreover, the wiring is subjected to external noise, which may reduce reliability of signals. Accordingly, it is preferable that a semiconductor module and a semiconductor device having a semiconductor module mounted thereon be designed in view of the environment in which the semiconductor module and the semiconductor device are to be used.

RELATED ART DOCUMENTS

Patent Documents

Patent Document 1: Japanese Patent Application Publication No. 2011-96268 (JP 2011-96268 A)

SUMMARY OF THE APPLICATION

Problems in the Related Art

In view of the above circumstances, it is desired to provide a semiconductor device having mounted thereon a semiconductor module in which input and output terminals adapted for an environment in which the semiconductor module is to be used are arranged and such a semiconductor module.

Means for Solving the Problem

In one aspect, a semiconductor device includes: a semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element; and a main substrate that has a plurality of wiring layers and that has the semiconductor module surface-mounted thereon via the plurality of connection terminals, wherein the plurality of connection terminals are arranged in a plurality of rectangular rings along each side of the support substrate, and include a first module terminal group and a second module terminal group which are terminal groups having one of an image output function and a communication interface function, the first module terminal group is located on a module first side that is one side of the support substrate, the second module terminal group is located on a module second side that is an opposite side from the module first side, the main substrate includes a first substrate terminal group and a second substrate terminal group which are connected to one of an image display device and a communication device, the first substrate terminal group is located on a substrate first side that is one side of the main substrate, the second substrate terminal group is located on a substrate second side that is an opposite side from the substrate first side, the semiconductor module is surface-mounted on a surface wiring layer of the main substrate so that the module first side is located closer to the substrate first side than the module second side and the module second side is located closer to the substrate second side than the module first side, and the first module terminal group and the first substrate terminal group are connected by a first surface wiring pattern formed in the surface wiring layer, and the second module terminal group and the second substrate terminal group are connected by a second surface wiring pattern formed in the surface wiring layer.

In another aspect, in a semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element, the connection terminals include a first module terminal group and a second module terminal group which are terminal groups having one of an image output function and a communication interface function, and the first module terminal group is located on a module first side that is one side of the support substrate, and the second module terminal group is located on a module second side that is an opposite side from the module first side.

With this configuration, the plurality of types of terminal groups having the image output function (or the plurality of types of terminal groups having the communication interface function) in the semiconductor module are arranged according to the positions where circuits (including terminals such as a connector) corresponding to each function are located on the main substrate on which the semiconductor module is mounted. Accordingly, when the semiconductor module is mounted on the main substrate, connection can be made by using the wiring patterns formed in the surface wiring layer. As a result, the number of wiring patterns to be formed in an inner layer of the main substrate can be reduced, which can restrain an increase in the number of layers of the main substrate. In the semiconductor module itself as well, terminals are arranged in view of a circuit substrate on which the semiconductor module is to be mounted, whereby the semiconductor module can be mounted on the circuit substrate with improved mount efficiency. With the above configuration, a semiconductor device having mounted thereon a semiconductor module in which input and output terminals adapted for the environment in which the semiconductor module is to be used are arranged and such a semiconductor module can be provided.

Further features and advantages of various exemplary embodiments of the semiconductor device and the semiconductor module will become apparent from the following description of embodiments of the semiconductor module which will be described with reference to the accompanying drawings

BRIEF DESCRIPTION OF THE DRAWINGS

FIG. 1 is a schematic view showing the relationship between a semiconductor module and peripheral devices.

FIG. 2 is a schematic section showing the structure of the semiconductor module.

FIG. 3 is a schematic perspective view showing general terminal arrangement of the semiconductor module.

FIG. 4 is an illustration schematically showing an example of allocation of terminals according to the functions of the semiconductor module.

FIG. 5 is an illustration schematically showing the relationship between a semiconductor element and the terminals of the semiconductor module.

FIG. 6 is an illustration schematically showing another example of allocation of terminals according to the functions of the semiconductor module.

FIG. 7 is an illustration schematically showing still another example of allocation of terminals according to the functions of the semiconductor module.

FIG. 8 is a functional block diagram showing an example of a system LSI.

FIG. 9 is an illustration showing an example of typical allocation of terminals according to the functions of the system LSI.

FIG. 10 is a schematic section showing the structure of a semiconductor module (SOC).

FIG. 11 is a schematic section showing the structure of a semiconductor module (MCM).

FIG. 12 is a schematic section showing the structure of a semiconductor module (SIP).

FIG. 13 is a schematic section showing the structure of a semiconductor device including the SOC.

FIG. 14 is a schematic section showing the structure of a semiconductor device including the MCM.

FIG. 15 is a schematic section showing the structure of a semiconductor device including the SIP.

FIG. 16 is an illustration showing an example of how terminal arrangement is changed on a support substrate.

FIG. 17 is a perspective view showing an example of terminal arrangement in a semiconductor module.

FIG. 18 is a perspective view of a navigation unit.

PREFERRED EMBODIMENTS

Figure 19:
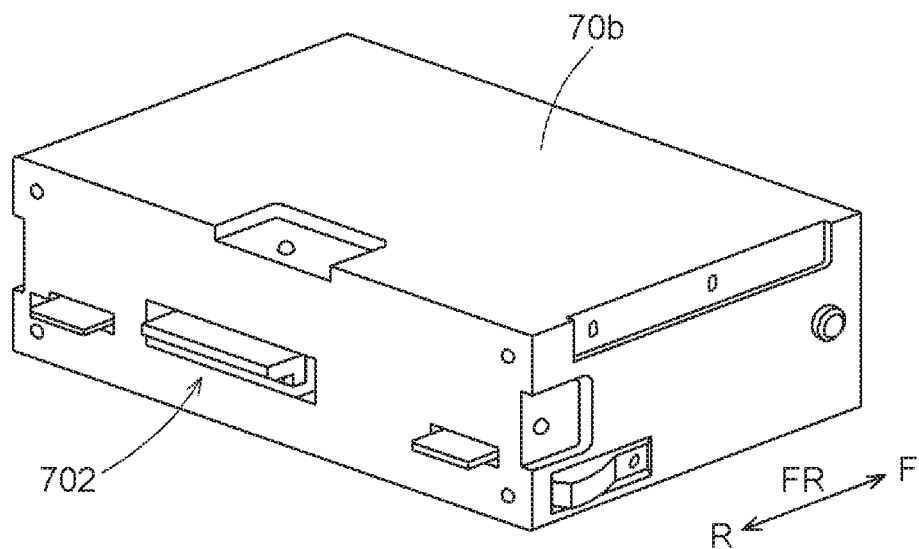
FIG. 19 is a perspective view of a body unit of the navigation unit.
Figure 20:
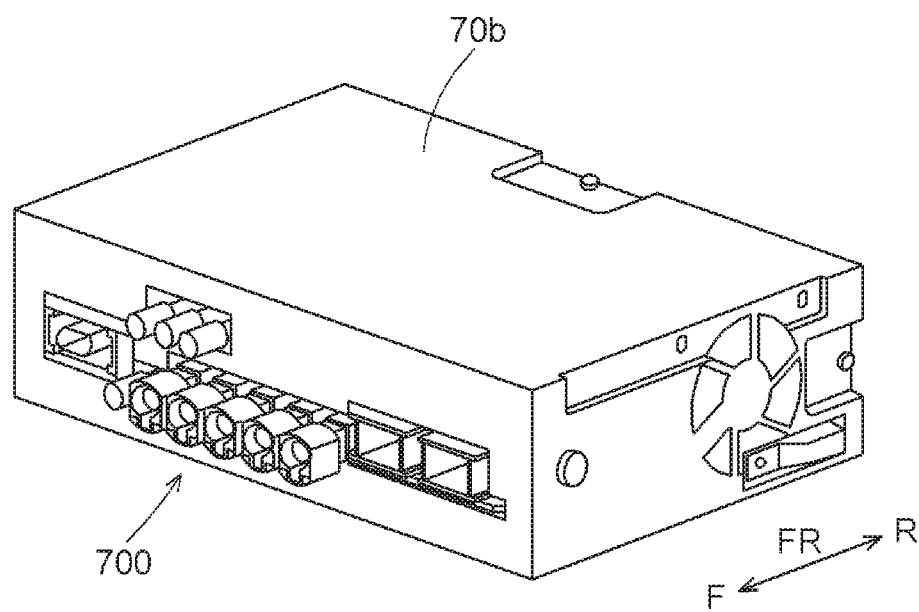
FIG. 20 is a perspective view of the body unit of the navigation unit as viewed in a different direction.

Embodiments of a semiconductor module including a single semiconductor element or a plurality of semiconductor elements and having a plurality of functions integrated therein, and a semiconductor device including the semiconductor module will be described with reference to the accompanying drawings. As shown in FIG. 1, a semiconductor device 1 includes a circuit board (main substrate 3) having a plurality of layers (30$a$, 30$b$, 30$c$, 30$z$) with wiring layers located in the surface layers (30$a$, 30$z$) and the inner layers (30$b$, 30$c$), and a semiconductor module 5 mounted on the main substrate 3. For example, the semiconductor module 5, together with other circuit components, not shown, is mounted on the main substrate 3 and serves as a core for an electronic control unit (ECU) as the semiconductor device 1. In the present embodiment, the ECU is a control device for an in-vehicle information terminal. As shown in FIG. 1, the semiconductor device 1 is connected to a front-seat monitor device 71 mounted on a console etc. of a front seat, a rear-seat monitor device 72 mounted on the rear seat side, a hard disk device 73 having a map database for a navigation system etc. stored therein, a digital versatile disk (DVD) player 74, a rear camera 76, etc., and controls these devices.

For example, as shown in FIGS. 2 and 10 to 12, the semiconductor module 5 includes at least one semiconductor element 51 and a support substrate 21 that supports and fixes the semiconductor element 51 on its upper surface 21$a$. A plurality of terminals 10 (connection terminals) electrically connected to the semiconductor element 51 are arranged planarly on a lower surface 21$b$ of the support substrate 21 so as to project from the lower surface 21$b$.

FIG. 2 schematically shows a general structure of the semiconductor module 5 (system LSI (system on a chip (SOC) 5C)) including a single semiconductor element 51 (semiconductor die 51$d$). FIG. 10 schematically shows the structure of the semiconductor module 5 (system LSI 5C) that is a single package with a plurality of semiconductor elements 51 (semiconductor dies 51$d$) enclosed therein. The semiconductor dies 51$d$ are supported and fixed on the upper surface 21$a$ of the support substrate 21 (package substrate). Reference character "51C" represents the semiconductor elements 51 in the system LSI 5C. Even in the case where the semiconductor module 5 includes a single semiconductor element 51 (semiconductor die 51*d*), a system LSI 5C may be configured as a large scale integration circuit (LSI) having integrated on a single semiconductor element 51 (semiconductor die 51*d*) a plurality of circuit blocks (mega cells) having specific functions.

FIG. 11 shows an example in which the semiconductor module 5 is configured as a hybrid IC called a multichip module 5M (MCM). The multichip module 5M is configured as a module having mounted on a single support substrate 21 (module substrate) a plurality of semiconductor elements 51 (such as semiconductor chips shown by reference character "51M") having specific functions. FIG. 11 shows an example in which a processor 51*b* such as a microcomputer or a digital signal processor (DSP) and a peripheral chip such as a memory 51*q* are mounted as a plurality of semiconductor elements 51 (51M) having specific functions on the support substrate 21. FIG. 12 shows an example in which the semiconductor module 5 is configured as a hybrid IC called a system in a package (SIP) 5P. For example, the semiconductor module 5 as the SIP 5P is configured as a hybrid IC that is a single package having integrated therein a plurality of semiconductor elements 51 (such as semiconductor chips shown by reference character "51P") having specific functions.

The semiconductor element 51 has terminal arrangement according to an internal cell structure etc. However, when the semiconductor module 5 is configured by using the semiconductor element 51, the terminal arrangement can be changed on the support substrate 21. That is, arrangement of terminals 10 of the semiconductor module 5 can be set on the support substrate 21 so as to achieve the terminal arrangement suitable for being mounted on the main substrate 3. Mounting and connecting a plurality of semiconductor elements 51 on the support substrate 21 can eliminate terminals that are connected only between the semiconductor elements 51 from the terminals 10 of the semiconductor module 5. Since the total number of terminals 10 is reduced, the terminals 10 can be arranged more appropriately. For example, the multichip module 5M shown in FIG. 11 includes the processor 51*b* and the memory 51*q*. In many cases, the processor 51*b* has terminals that are connected to the memory 51*q*. The number of terminals that are connected to the memory 51*q* is large because the terminals include those for bus signals of an address bus, a data bus, etc. Connecting the processor 51*b* and the memory 51*q* on the support substrate 21 can eliminate such terminals for bus signals from the terminals 10 of the semiconductor module 5.

A semiconductor vendor's webpage <http://japan.renesas.com/applications/automotive/cis/cis_highend/rcar_h2/index.jsp> [searched on Aug. 25, 2015] discloses an example of an SOC for an in-vehicle information terminal (SOC 500). FIG. 8 is a block diagram showing the functional configuration of this SOC for an in-vehicle information terminal (SOC 500), reprinted in a simplified form from the webpage. As shown in the figure, this SOC includes a plurality of (three) functional blocks for image output (Display Out). The SOC 500 further includes a plurality of (for a total of four) functional blocks of a high-speed communication interface such as Universal Serial Bus (USB) (USB 2.0 Host, USB 3.0 Host).

The mega cells and input and output terminals in the system LSI are usually arranged close to each other so that the wiring distance on the semiconductor element is short. FIG. 9 schematically shows an example of arrangement of the input and output terminals in the system LSI. As shown in FIG. 9, in the case where two image output terminals (VO1, VO2) are provided, these two output terminals are placed close to each other. Similarly, in the case where two input and output terminals of the high-speed communication interface (FT1, FT2) are provided, the two input and output terminals are also arranged close to each other.

Referring to the block diagram of FIG. 8, in, e.g., in-vehicle applications, the image output terminals are connected to a front-seat monitor device (Front Monitor) mounted on a console etc. of a front seat and a rear-seat monitor device (Rear Monitor) mounted on the rear seat side. An electronic control unit (ECU) on which the SOC 500 is mounted is often arranged in a middle part of the vehicle, e.g., between the front seat and the rear seat. As shown in FIG. 9, in the case where the two image output terminals are disposed at a single location, the wiring distance between one of the front-seat monitor device and the rear-seat monitor device and the SOC 500 may be long. Due to long wiring to one of the monitor devices on a wiring board of the ECU, the wiring board of the ECU may be increased in size. The long wiring increases radiation noise, which may affect other circuits. Moreover, the wiring is subjected to external noise, which may reduce reliability of signals. Accordingly, it is preferable that such a semiconductor module as the SOC 500 be designed in view of the environment in which the semiconductor module is to be used.

FIGS. 13 to 15 show examples of the configuration of the semiconductor device 1 having the semiconductor module 5 shown in FIGS. 10 to 12 mounted on the main substrate 3. FIG. 13 schematically shows an example of the semiconductor device 1 (1C) having surface-mounted on the main substrate 3 the system LSI 5C serving as the semiconductor module 5. FIG. 14 schematically shows an example of the semiconductor device 1 (1M) having surface-mounted on the main substrate 3 the multichip module 5M serving as the semiconductor module 5. FIG. 15 schematically shows an example of the semiconductor device 1 (1P) having surface-mounted on the main substrate 3 the SIP 5P serving as the semiconductor module 5.

As shown in FIG. 2, the present embodiment shows an example in which the semiconductor module 5 includes a single semiconductor element 51. The semiconductor element 51 is a system SLI (also referred to as a system on a chip (SOC)) having integrated on a single semiconductor element a plurality of circuit blocks (mega cells) having specific functions. The semiconductor module 5 includes the support substrate 21, bonding wires 25, electrode patterns 26, and a mold portion 22. The semiconductor element 51 is mounted on the upper surface 21*a* (mount surface) that is one surface of the support substrate 21. The electrode patterns 26 corresponding to each electrode pad (not shown) formed on the semiconductor element 51 are formed on the upper surface 21*a*. The electrode pads and the electrode patterns 26 are connected by the bonding wires 25. The electrode patterns 26 are electrically connected via through holes 27 to the lower surface 21*b* (terminal surface) that is located on the opposite side from the upper surface 21*a*. Spherical bumps that serve as the terminals 10 (connection terminals) of the semiconductor module 5 are formed on the lower surface 21*b* so as to be electrically connected to the electrode patterns 26.

The semiconductor element 51 and the bonding wires 25 are molded with, e.g., a resin material. In the semiconductor module 5 shown in FIG. 2, the support substrate 21 and the mold portion 22 correspond to a package 2 that accommodates the semiconductor element 51. As described above, the package 2 has the terminals 10, namely ball-shaped terminals (spherical bumps), formed on its lower surface 2r so as to project from the lower surface 2r. A ball grid array (BGA) semiconductor module 5 is thus formed. The semiconductor modules 5 (5C, 5M, 5P) shown in FIGS. 10 to 12 are also BGA semiconductor modules 5.

FIG. 3 is a schematic perspective view of the lower surface 21b (the terminal surface, the lower surface 2r of the package 2) of the semiconductor module 5 as viewed from the upper surface 21a (the mount surface of the support substrate 21) side. In FIG. 3, dashed circles show the terminals 10. The number of terminals 10, the size of the terminals 10, the intervals therebetween, etc. are schematically shown in FIG. 3. In the present embodiment, the terminals 10 include an inner peripheral terminal group 15 arranged in a rectangular pattern in the central part of the package 2, and an outer peripheral terminal group 17 arranged in a rectangular ring (in this example, in three rectangular rings) along the outer peripheral part of the package 2. The inner peripheral terminal group 15 is mainly comprised of those terminals 10 which are connected to power supply electrode pads of the semiconductor element 51.

The inner peripheral terminal group 15 has terminals 10 in its central part as well and has no space in the center. In the inner peripheral terminal group 15 consisting of 36 terminals 10 in FIG. 3, however, the four terminals 10 located in the central part, the outermost twenty terminals 10, and the twelve terminals 10 located between the four terminals 10 in the central part and the outermost twenty terminals 10 are arranged in rectangular rings (in three rectangular rings). Accordingly, even though the terminals 10 are closely arranged like the inner peripheral terminal group 15 shown in FIG. 3, it can be said that the terminals 10 are arranged in rectangular rings.

The inner peripheral terminal group 15 is located substantially immediately under the semiconductor element 51 (at a position where the inner peripheral terminal group 15 at least partially overlaps the semiconductor element 51 as viewed in the direction perpendicular to the surface of the support substrate 21 (the direction perpendicular to the support substrate). The direction perpendicular to the surface of the main substrate 3 (the direction perpendicular to the main substrate) with the semiconductor module 5 being mounted on the main substrate 3 is substantially synonymous with the direction perpendicular to the support substrate, if component tolerance and mount variation are ignored. Accordingly, the direction perpendicular to the main substrate and the direction perpendicular to the support substrate are regarded as the same direction in the specification and the drawings unless otherwise specified.

Since the inner peripheral terminal group 15 is located substantially immediately under the semiconductor element 51 and the power supply terminals are included in the inner peripheral terminal group 15, electric power can be supplied to the semiconductor element 51 with the minimum influence of electrical resistance and inductance. In the case where the semiconductor module 5 has a plurality of semiconductor elements 51 as shown in FIGS. 10 to 12, the inner peripheral terminal group 15 is placed immediately under the semiconductor element 51 (target semiconductor element) to which electric power is to be supplied through the inner peripheral terminal group 15. The terminals 10 of the outer peripheral terminal group 17 are signal terminals that are connected to the in-vehicle information terminal (a monitor device, a camera, a disk device, etc.).

As shown in FIG. 1, the semiconductor module 5 mounted on the semiconductor device 1 is connected to the front-seat monitor device 71, the rear-seat monitor device 72, the hard disk device 73, the DVD player 74, the rear camera 76, etc. In the present embodiment, the front-seat monitor device 71 is connected to a first image output terminal group 31 (VO1) that will be described later with reference to FIG. 4 etc. through a first surface wiring pattern 311 and a first substrate terminal group 301 which will be described later. The rear-seat monitor device 72 is connected to a second image output terminal group 32 (VO2) through a second surface wiring pattern 312 and a second substrate terminal group 302 which will be described later. The hard disk device 73 is connected to a first high-speed communication interface (IF) terminal group 33 (FT1), and the DVD player 74 is connected to a second high-speed communication interface (IF) terminal group 34 (FT2) through the first surface wiring pattern 311 and the first substrate terminal group 301. The rear camera 76 is connected to a video input terminal group 39 (VI).

In the case where the two image output terminal groups, namely the first image output terminal group 31 (VO1) and the second image output terminal group 32 (VO2), are disposed at a single location as shown in FIG. 9, the wiring distance between one of the front-seat monitor device 71 and the rear-seat monitor device 72 and the semiconductor module 5 may be long. Similarly, in the case where the two high-speed communication interface terminal groups, namely the first high-speed communication interface terminal group 33 (FT1) and the second high-speed communication interface terminal 34 (FT2), are disposed at a single location as shown in FIG. 9, the wiring distance between one of the hard disk device 73 and the DVD player 74 and the semiconductor module 5 may be long. Due to the need for long wiring to one of the two devices on the main substrate 3 of the semiconductor device 1, the main substrate 3 of the semiconductor device 1 may be increased in size. The long wiring increases radiation noise, which may affect other circuits. Moreover, the wiring is subjected to external noise, which may reduce reliability of signals.

As a solution to this, in the present embodiment, as shown in FIG. 4, the first image output terminal group 31 (VO1) is located on a module first side 2a of the support substrate 21, and the second image output terminal group 32 (VO2) is located on a module second side 2c that is the opposite side from the module first side 2a. That is, as shown in FIGS. 1 and 4, the first image output terminal group 31 (VO1) is located on the front-seat monitor device 71 side, and the second image output terminal group 32 (VO2) is located on the rear-seat monitor device 72 side. This arrangement can achieve appropriate wiring distances between both the front-seat monitor device 71 and the rear-seat monitor device 72 and the semiconductor module 5. Examples of allocation of the terminals 10 in FIG. 4 and the subsequent figures are similarly shown by perspective views of the semiconductor module 5 as viewed from the upper surface 21a (the mount surface of the support substrate 21) side.

The first image output terminal group 31 (VO1) and the second image output terminal group 32 (VO2) are terminal groups complying with, e.g., the High-Definition Multimedia Interface (HDMI) (registered trademark) standard or the Low Voltage Differential Signaling (LVDS) standard. The first image output terminal group 31 (VO1) and the second image output terminal group 32 (VO2) may comply with the same standard or different standards.

Moreover, in the present embodiment, as shown in FIG. 4, the first high-speed communication interface terminal group 33 (FT1) is located on the module first side 2a, and the second high-speed communication interface terminal group 34 (FT2) is located on the module second side 2c that is the opposite side from the module first side 2a. That is, as shown in FIGS. 1 and 4, the first high-speed communication interface terminal group 33 (FT1) is located on the hard disk device 73 side, and the second high-speed communication interface terminal group 34 (FT2) is located on the DVD player 74 side. This arrangement can achieve appropriate wiring distances between both the hard disk device 73 and the DVD player 74 and the semiconductor module 5.

The first high-speed communication interface terminal group 33 (FT1) and the second high-speed communication interface terminal group 34 (FT2) are terminal groups complying with, e.g., a standard such as Serial AT Attachment (SATA), Peripheral Component Interconnect Express (PCIe), Universal Serial Bus (USB) 2.0, or USB 3.0. Like the image output terminal groups, the first high-speed communication interface terminal group 33 (FT1) and the second high-speed communication interface terminal group 34 (FT2) may comply with the same standard or different standards.

In the present embodiment, the video input terminal group 39 (VI) is also located on the module second side 2c, which can achieve an appropriate wiring distance between the rear camera 76 disposed in the rear of the vehicle and the semiconductor module 5. In FIG. 4, a card interface (IF) terminal group 36 (CRD) is a terminal group that is connected to a reader/writer of a memory card such as an SD memory card or a multimedia card (MMC). In recent years, such a memory card reader/writer is sometimes mounted on the console of the front seat. Accordingly, in the present embodiment, the card interface terminal group 36 (CRD) is located on the module first side 2a.

A wireless communication interface (IF) terminal group 38 (WLT) is a terminal group that is connected to a communication device (a router etc.) adapted to WiFi or Ethernet (registered trademark) Audio/Video Bridging (AVB). In view of the transmission and reception environment, it is preferable that the communication device be placed near the windshield. In the present embodiment, the wireless communication interface terminal group 38 (WLT) is located on the module first side 2a.

Other terminal groups, for example, a medium to low-speed communication interface (IF) terminal group 37 (SMT) and an audio interface (IF) terminal group 41 (AU), are located at appropriate positions in view of wiring to devices to which these terminal groups are to be connected, although the priority for these terminal groups is lower than that for the above terminals.

In the semiconductor element 51, a signal processing unit that performs signal processing implementing a function corresponding to the first image output terminal group 31 (VO1) and a signal processing unit that performs signal processing implementing a function corresponding to the second image output terminal group 32 (VO2) have many common circuit configurations. Similarly, in the semiconductor element 51, a signal processing unit that performs signal processing implementing a function corresponding to the first high-speed communication interface terminal group 33 (FT1) and a signal processing unit that performs signal processing implementing a function corresponding to the second high-speed communication interface terminal group 34 (FT2) have many common circuit configurations. It is therefore preferable that the signal processing units having the same function (similar functions) and a power unit (power supply unit) that supplies electric power to the signal processing units be located close to each other in the semiconductor element 51.

FIG. 5 schematically shows the relationship between signal processing units (53, 54, 55, 56) and power units (57, 58) for the image output terminal groups (31, 32) and the high-speed communication interface terminal groups (33, 34) and the terminal groups (31, 32, 33, 34). The first image output processing unit 53 (B-VO1) is a signal processing unit that performs signal processing implementing a function corresponding to the first image output terminal group 31 (VO1), and the second image output processing unit 54 (B-VO2) is a signal processing unit that performs signal processing implementing a function corresponding to the second image output terminal group 32 (VO2). The first high-speed communication processing unit 55 (B-FT1) is a signal processing unit that performs signal processing implementing a function corresponding to the first high-speed communication interface terminal group 33 (FT1), and the second high-speed communication processing unit 56 (B-FT2) is a signal processing unit that performs signal processing implementing a function corresponding to the second high-speed communication interface terminal group 34 (FT2). The image output power unit 57 (PW-VO) is a power supply unit that supplies common operating power to the first image output processing unit 53 (B-VO1) and the second image output processing unit 54 (B-VO2), and the high-speed communication power unit 58 (PW-FT) is a power supply unit that supplies common operating power to the first high-speed communication processing unit 55 (B-FT1) and the second high-speed communication processing unit 56 (B-FT2).

The first image output processing unit 53 (B-VO1), the second image output processing unit 54 (B-VO2), and the image output power unit 57 (PW-VO) are located close to each other in a continuous region in the semiconductor element 51. Similarly, the first high-speed communication processing unit 55 (B-FT1), the second high-speed communication processing unit 56 (B-FT2), and the high-speed communication power unit 58 (PW-FT) are also located close to each other in a continuous region in the semiconductor element 51.

The first image output processing unit 53 (B-VO1) is electrically connected to a first image output electrode group 81 (electrode pad group) (E-VO1) on the semiconductor element 51, and the first image output electrode group 81 (E-VO1) and the electrode patterns 26 on the back side of the first image output terminal group 31 (VO1) are electrically connected by, e.g., the bonding wires 25 in the package 2. The second image output processing unit 54 (B-VO2) is electrically connected to a second image output electrode group 82 (electrode pad group) (E-VO2) on the semiconductor element 51, and the second image output electrode group 82 (E-VO2) and the electrode patterns 26 on the back side of the second image output terminal group 32 (VO2) are electrically connected by, e.g., the bonding wires 25 in the package 2. In the present embodiment, the second image output processing unit 54 (B-VO2) and the second image output electrode group 82 (E-VO2) are located close to each other, but the first image output processing unit 53 (B-VO1) and the first image output electrode group 81 (E-VO1) are separated from each other. Accordingly, the first image output processing unit 53 (B-VO1) and the first image output electrode group 81 (E-VO1) are electrically connected through the inside of a circuit with other functions which is formed in the central part of the semiconductor element 51.

Similarly, the first high-speed communication processing unit 55 (B-FT1) is electrically connected to a first high-speed communication electrode group 83 (electrode pad group) (E-FT1) on the semiconductor element 51, and the first high-speed communication electrode group 83 (E-FT1) and the electrode patterns 26 on the back side of the first high-speed communication interface terminal group 33 (FT1) are electrically connected by, e.g., the bonding wires 25 in the package 2. The second high-speed communication processing unit 56 (B-FT2) is electrically connected to a second high-speed communication electrode group 84 (electrode pad group) (E-FT2) on the semiconductor element 51, and the second high-speed communication electrode group 84 (E-FT2) and the electrode patterns 26 on the back side of the second high-speed communication interface terminal group 34 (FT2) are electrically connected by, e.g., the bonding wires 25 in the package 2. In the present embodiment, the second high-speed communication processing unit 56 (B-FT2) and the second high-speed communication electrode group 84 (E-FT2) are located close to each other, but the first high-speed communication processing unit 55 (B-FT1) and the first high-speed communication electrode group 83 (E-VO1) are separated from each other. Accordingly, the first high-speed communication processing unit 55 (B-FT1) and the first high-speed communication electrode group 83 (E-FT1) are electrically connected through the inside of a circuit with other functions, which is formed in the central part of the semiconductor element 51.

As described above with reference to FIG. 2, the semiconductor module 5 has the semiconductor element 51 mounted on the mount surface (upper surface 21a) of the support substrate 21 and has the terminals 10 formed on the lower surface 21b that is located on the opposite side from the upper surface 21a. That is, the semiconductor element 51 and the terminals 10 are connected via wiring (including the through holes 27) formed in the support substrate 21. FIG. 5 shows an example in which the electrode pad groups are located in separate regions in the semiconductor element 51 and each electrode pad group and each terminal group (electrode patterns 26) which are located close to each other are connected by the bonding wires 25. However, even if each electrode pad group and each terminal group are not located close to each other, the terminal groups may be located in different regions (on the opposite sides) by using wiring on the support substrate 21.

For example, in FIG. 5, the first image output electrode group 81 (E-VO1) located on the opposite side from the side on which the second image output electrode group 82 (E-VO2) is located may be located adjacent to the second image output electrode group 82 (electrode pad group). In this case, the first image output electrode group 81 (E-VO1) and the electrode patterns 26 formed on the upper surface 21a of the support substrate 21 are connected by the bonding wires 25 at a position near the first image output electrode group 81 (E-VO1). These electrode patterns 26 are formed at a position that is not located on the same side as the first image output terminal group 31 (VO1). Wiring patterns extending in the support substrate 21 (the upper surface 21a or an inner wiring layer) are formed between these electrode patterns 26 and the back surface of the first image output terminal group 31 (VO1).

In each example, common operating power is supplied from the common power supply unit to the signal processing units having the same function (similar functions). This configuration restrains an increase in circuit scale of the semiconductor element 51 because the terminals 10 are arranged in separate regions.

As described above, the semiconductor module 5 has a single rectangular package 2 having a plurality of terminals 10, and a first module terminal group 11 and a second module terminal group 12 which are terminal groups each having one of an image output function and a communication interface function. In the above description, the first image output terminal group 31 (VO1) and the first high-speed communication interface terminal group 33 (FT1) correspond to the first module terminal group 11. In the above description, the second image output terminal group 32 (VO2) and the second high-speed communication interface terminal group 34 (FT2) correspond to the second module terminal group 12. As described above, the first module terminal group 11 (31, 33) is located on the module first side 2a, and the second module terminal group 12 (32, 34) is located on the module second side 2c that is the opposite side from the module first side 2a.

The above description shows an example in which both the terminal groups having the image output function and the terminal groups having the communication interface function include the first module terminal group 11 and the second module terminal group 12. However, the semiconductor module 5 need only have a plurality of terminal groups having one of these functions. That is, the semiconductor module 5 may have the first module terminal group 11 and the second module terminal group 12 as terminal groups having the image output function, or may have the first module terminal group 11 and the second module terminal group 12 as terminal groups having the communication interface function.

The semiconductor module 5 further includes a first signal processing unit 61 that performs signal processing implementing a function corresponding to the first module terminal group 11, a second signal processing unit 62 that performs signal processing implementing a function corresponding to the second module terminal group 12, and a power supply unit 63 that supplies common operating power to the first signal processing unit 61 and the second signal processing unit 62. In the above description, the first image output processing unit 53 (B-VO1) and the first high-speed communication processing unit 55 (B-FT1) correspond to the first signal processing unit 61, and the second image output processing unit 54 (B-VO2) and the second high-speed communication processing unit 56 (B-FT2) correspond to the second signal processing unit 62. The image output power unit 57 (PW-VO) and the high-speed communication power unit 58 (PW-FT) correspond to the power supply unit 63.

The above description shows an example in which the semiconductor module 5 has the first module terminal group 11 and the second module terminal group 12 as terminal groups having the same function (similar functions). However, the number of terminal groups is not limited to two, and three or more terminal groups may be provided. FIG. 6 shows an example in which the semiconductor module 5 has a third module terminal group 13 in addition to the first module terminal group 11 and the second module terminal group 12. The third module terminal group 13 is a terminal group having one of the image output function and the communication interface function and is a terminal group having the same function as (similar function to) the first module terminal group 11 and the second module terminal group 12. In view of arrangement of peripheral devices that are connected to the semiconductor module 5 and the semiconductor module 5, it is preferable that the third module terminal group 13 be located on a module third side ("2b" or "2d") different from the module first side 2a and the module second side 2c. Since the terminal groups having the same function (similar functions) are distributed on three of the four sides of the rectangular support substrate 21, flexibility in arrangement of the peripheral devices that are connected to the semiconductor module 5 and the semiconductor module 5 is improved. Moreover, efficiency of wiring between the semiconductor module 5 and each peripheral device is also improved.

FIG. 6 shows an example in which the semiconductor module 5 has a third high-speed communication interface (IF) terminal group 35 (FT3) as the third module terminal group 13 having a high-speed communication interface function. In FIG. 6, the third high-speed communication interface terminal group 35 is located on the side shown by reference character "2d," and the side "2d" is the module third side. It should be understood that the third high-speed communication interface terminal group 35 (FT3) may be located on the side shown by reference character "2b." In this case, the side "2b" is the module third side.

In the examples described above with reference to FIGS. 4, 6, etc., the first module terminal group 11 is placed so that the terminals thereof are located next to each other along the module first side 2a, and the second module terminal group 12 is placed so that the terminals thereof are located next to each other along the module second side 2c. By placing the terminal groups so that the terminals are located next to each other along the opposite sides in this manner, efficient wiring can be implemented in the case where devices to which the terminal groups are connected are placed with the semiconductor module 5 interposed therebetween. However, the first module terminal group 11 need only be located relatively close to the module first side 2a, and the second module terminal group 12 need only be located relatively close to the module second side 2c. Such arrangement is effective in improving wiring efficiency.

That is, like the first high-speed communication interface terminal group 33 (FT1) in FIG. 7, even when a terminal group is placed along the side "2d" between the module first side 2a and the module second side 2c so that the terminals thereof are located next to each other in the direction perpendicular to the module first side 2a, the terminal group need only be located close to the module first side 2a relative to the second high-speed communication interface terminal group 34 (FT2). Similarly, like second high-speed communication interface terminal group 34 (FT2) in FIG. 7, even when a terminal group is placed along the side "2d" between the module second side 2c and the module first side 2a so that the terminals thereof are located next to each other in the direction perpendicular to the module second side 2c, the terminal group need only be located close to the module second side 2c relative to the first high-speed communication interface terminal group 33 (FT1). It is more preferable that, as shown in FIG. 7, at least a part of the terminals 10 of the first high-speed communication interface terminal group 33 (FT1) be located along the module first side 2a. Similarly, it is more preferable that at least a part of the terminals 10 of the second high-speed communication interface terminal group 34 (FT2) be located along the module second side 2c.

As described above, the semiconductor element 51 has the terminal arrangement according to the semiconductor element 51. However, the terminal arrangement can be changed on the support substrate 21. That is, the arrangement of the terminals 10 of the semiconductor module 5 may be set on the support substrate 21 so as to achieve the terminal arrangement suitable for being mounted on the main substrate 3. By connecting the plurality of semiconductor elements 51 on the support substrate 21, the terminals that are connected only between the semiconductor elements 51 can be eliminated from the terminals 10 of the semiconductor module 5. Since the total number of terminals 10 is reduced, the terminals 10 can be arranged more appropriately. FIG. 16 shows the relationship between the terminal arrangement of the processor 51b (semiconductor chip) and the terminal arrangement of the multichip module 5M in the case where the processor 51b and the memory 51q are mounted as in the multichip module 5M shown in FIG. 11.

In FIG. 16, each terminal group (a plurality of element terminals) of the processor 51b is as follows. MEM1 and MEM2 represent terminal groups that are connected to the memory 51q, VO1, VO2, VO3, and VO4 represent image output terminal groups, FT1, FT2, FT3, and FT4 represent high-speed communication interface terminal groups, VI represents a video input terminal group. In the processor 51b, the four types of image output terminal groups are located on the same side of a chip, and the four types of high-speed communication interface terminals are also located on the same side of the chip.

VO1, VO2, VO3, VO4, FT1, FT2, FT3, and FT4 correspond to a first element terminal group and a second element terminal group which are terminal groups (a plurality of element terminals) having one of the image output function and the communication interface function. Specifically, in the case where the first element terminal group and the second element terminal group are terminal groups having the image output function, the first element terminal group corresponds to one to three of VO1, VO2, VO3, and VO4, and the second element terminal group corresponds to one or three of VO1, VO2, VO3, and VO4 which do not correspond to the first element terminal group. Similarly, in the case where the first element terminal group and the second element terminal group are terminal groups having the communication interface function, the first element terminal group corresponds one to three of FT1, FT2, FT3, and FT4, and the second element terminal group corresponds to one or three of FT1, FT2, FT3, and FT4 which do not correspond to the first element terminal group.

The first element terminal group and the second element terminal group are located on the same side of a package. Specifically, in the case where the first element terminal group and the second element terminal group are terminal groups having the image output function, all of the terminal groups VO1, VO2, VO3, VO4 having the image output function are located on the side shown by reference character "50b." In the case where the first element terminal group and the second element terminal group are terminal groups having the communication interface function, all of the terminal groups FT1, FT2, FT3, FT4 having the communication interface function are located on the side shown by reference character "50d."

As described above, the semiconductor module 5 is a multichip module 5M having at least the processor 51b (semiconductor chip) mounted on the support substrate 21. In the multichip module 5M, the plurality of element terminals and the plurality of terminals 10 (connection terminals) have been rearranged on the support substrate 21. FIG. 16 shows an example in which the plurality of element terminals and the plurality of terminals 10 (connection terminals) have been rearranged so that at least the first element terminal group (VO1 of the processor 51b) is connected to the first module terminal group (the first image output terminal group 31 (VO1)) and the second element terminal group (VO2, VO3, and VO4 of the processor 51b) is connected to the second module terminal group (the second image output terminal group 32 (32a, 32b, 32c) (VO2)). In the processor 51b, all of the terminal groups VO1, VO2, VO3, VO4 having the image output function are located on the side shown by reference character "50b." In the multichip module 5M, however, VO1 is located on the module first side 2a, and VO2, VO3, and VO3 are located on the module second side 2c that is the opposite side from the module first side 2a. The terminal groups having the high-speed communication interface function are also distributed on different sides of the semiconductor module, but not on the opposite sides of the semiconductor module.

As described above, in the semiconductor module 5, the four types of image output terminal groups are distributed on different sides of the chip, and the four types of high-speed communication interface terminal groups are also distributed on different sides of the chip. Since MEM1 and MEM2 of the processor 51b are connected to the memory 51q on the support substrate 21 of the semiconductor module 5, MEM1 and MEM2 can be eliminated from the terminal groups of the semiconductor module 5. Flexibility in terminal arrangement in the semiconductor module 5 is thus improved. FIG. 17 schematically shows terminal arrangement corresponding to the semiconductor module 5 of FIG. 16. FIG. 17 shows an example of terminal arrangement by a perspective view of the lower surface of the semiconductor module 5 as viewed from the upper surface (the upper surface 21a of the support substrate 21) side.

FIGS. 18 to 21 show a navigation unit 70 (image display unit) on which the semiconductor device 1 is mounted. The navigation unit 70 is what is called a unit equipped with a display, which includes the front-seat monitor device 71, and is accommodated in, e.g., a middle part (console) of a dashboard of a vehicle. The front-seat monitor device 71 corresponds to the first display device that is mounted on the dashboard of the vehicle, and is mounted so that a display surface thereof faces toward the rear R in the longitudinal direction FR of the vehicle. That is, the navigation unit 70 is accommodated in the middle part of the dashboard located closer to the front F than an occupant in a passenger compartment, and is mounted so that the occupant can see the front-seat monitor device 71. The navigation unit 70 includes a display unit 70a having the front-seat monitor device 71 and a card slot 701, and a body unit 70b that accommodates the semiconductor device 1 shown in FIG. 21. The display unit 70a and the body unit 70b are configured with different housings and are mechanically coupled with metal fittings etc. The display unit 70a and the body unit 70b are electrically connected via a display connector 702 that will be described later. When the navigation unit 70 is mounted on the dashboard, the display unit 70a is located closer to the rear R than the body unit 70b.

As shown in FIG. 19, the display connector 702 that connects the display unit 70a and the semiconductor device 1 is provided in the body unit 70b so as to project beyond the body unit 70b. A connector group 700 that electrically connects the semiconductor device 1 and other devices is also provided in the body unit 70b so as to project beyond the body unit 70b. Examples of other devices include the rear-seat monitor device 72, a sub-display that is mounted on a meter panel of a vehicle, a center display that is mounted on a dashboard and displays operational information of an in-vehicle device such as an air conditioner, an outside temperature, or an audio device, the rear camera 76, and an in-vehicle communication device using a mobile phone network. The sub-display, the center display, the rear-seat monitor device 72, etc. correspond to the second display device.

Figure 21:
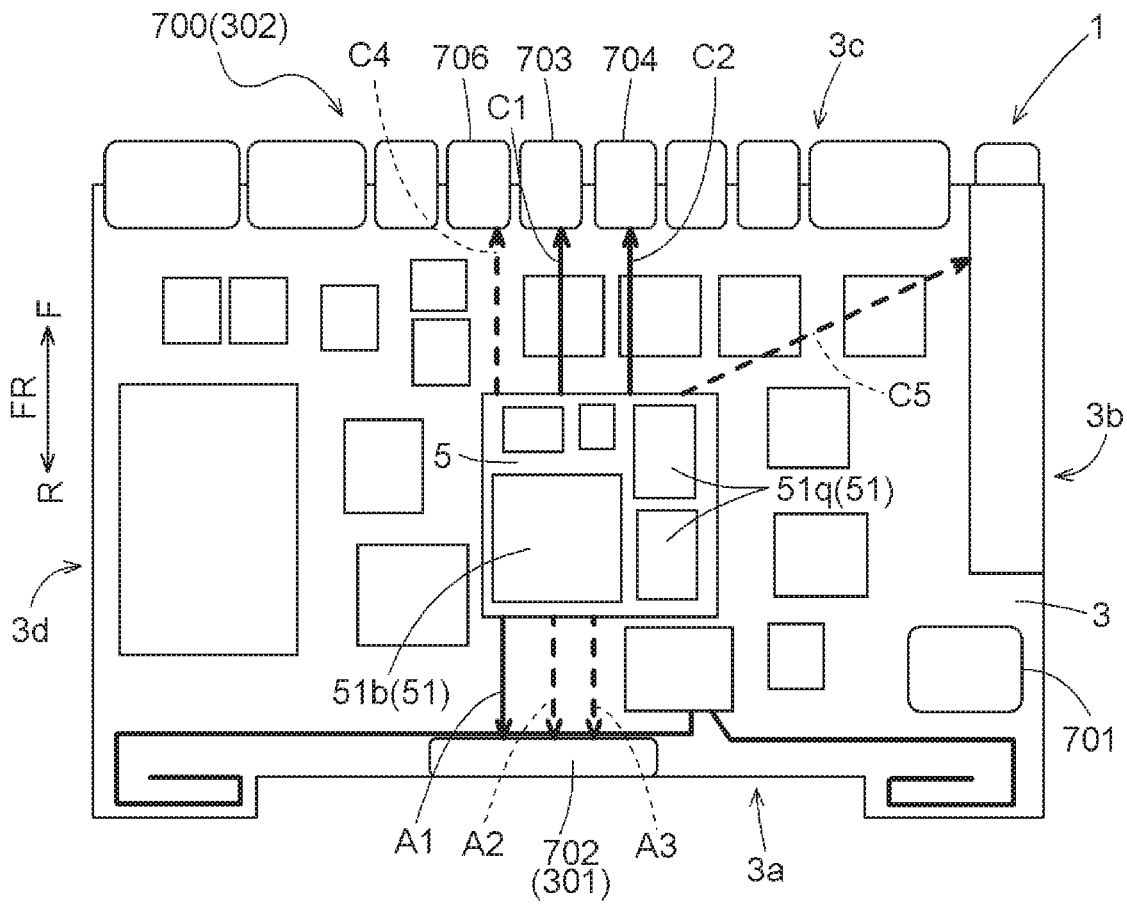
FIG. 21 is a view showing the layout of a main substrate that is mounted on the navigation unit and signal flows.
Figure 22:
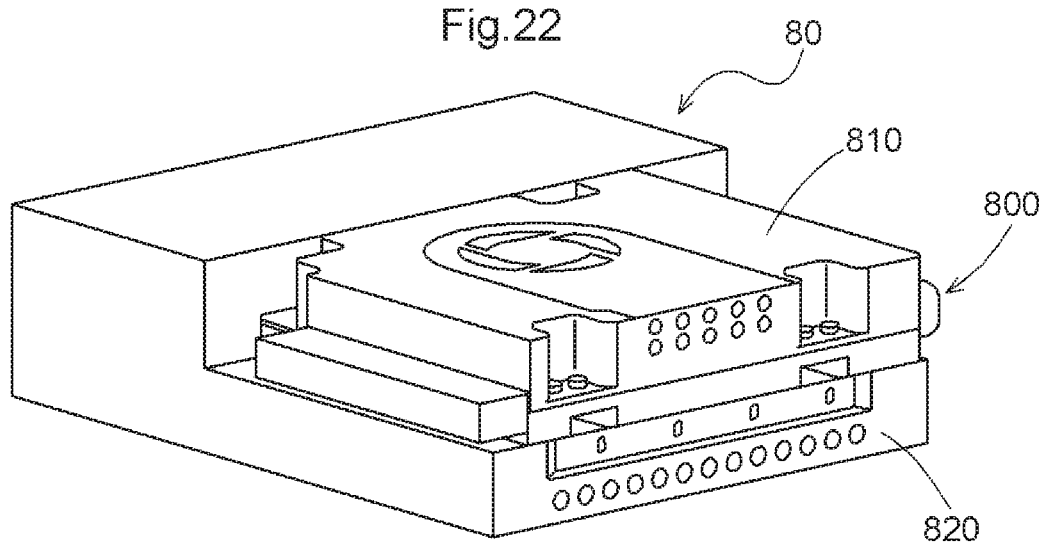
FIG. 22 is a perspective view of a multimedia unit.

FIG. 21 schematically shows the main substrate 3 on which the semiconductor module 5 is mounted. Thick solid arrows and thick dashed arrows in FIG. 21 schematically show the direction of wiring from the semiconductor module 5 to the substrate terminal groups (301, 302) of the main substrate 3. The surface wiring patterns (311, 312) are formed in the surface wiring layer 30a of the main substrate 3 so as to extend substantially along these arrows.

As shown in FIG. 21, terminals are provided on a substrate first side 3a of the main substrate 3 which is located on the rear R side in the longitudinal direction FR of the vehicle and a substrate second side 3c of the main substrate 3 which is located on the front F side in the longitudinal direction FR of the vehicle. That is, the main substrate 3 has terminal groups on the substrate first side 3a and the substrate second side 3c which are the opposite sides in the longitudinal direction FR. As described above, the display unit 70a is located closer to the rear R than the body unit 70b when the navigation unit 70 is mounted on the dashboard. Accordingly, the display connector 702 that transmits signals to and from the display unit 70a is placed on the substrate first side 3a that is located on the rear R side when the navigation unit 70 is mounted on the dashboard. The connector group 700 (703, 704, 706, etc.) is placed on the substrate second side 3c. The display connector 702 corresponds to the first substrate terminal group 301 and transmits image output signals, communication interface signals of PCIe, USB, etc. to the front-seat monitor device 71. Terminals corresponding to an image output (A1) to the front-seat monitor device 71 and communication interfaces (A2, A3) such as PCIe and USB are provided on the side of the semiconductor module 5 which faces the substrate first side 3a (the display connector 702 side) of the main substrate 3 when the semiconductor module 5 is mounted on the main substrate 3.

Terminal groups corresponding to image outputs (C1, C2) to a meter display, a center display, the rear-seat monitor device 72, etc. and a communication interface (C4) complying with the LVDS standard are provided on the side of the semiconductor module 5 which faces a different side from the substrate first side 3a, namely in this example, on the side of the semiconductor module 5 which faces the substrate second side 3c (the connector group 700 side) of the main substrate 3, i.e., the opposite side from the substrate first side 3a. As described above, these terminal groups are connected to devices different from the navigation unit 70 via the connectors (703, 704, 706). The connector group 700 corresponds to the second substrate terminal group 302. A terminal group corresponding to an interface (C5) with an LTE module for mobile phone communication is provided on the side of the semiconductor module 5 which is located closer to the substrate second side 3c than to the substrate first side 3a so that the terminals thereof are arranged along the substrate third side 3b.

As described above, the first module terminal group 11 and the second module terminal group 12 are module terminal groups having the image output function. The first substrate terminal group 301 and the second substrate terminal group 302 are substrate terminal groups that are connected to the image display device. The main substrate 3 is provided in the navigation unit 70 (image display unit) including the front-seat monitor device 71 (first display device). The first substrate terminal group 301 is connected to the front-seat monitor device 71 (first display device) in the navigation unit 70 (image display unit). The second substrate terminal group 302 is connected to the connector group 700 (external output terminal) provided in the navigation unit 70 (image display unit). The second substrate terminal group 302 is connected to the image display device (second display device such as the meter display, the center display, or the rear-seat monitor device 72) provided independently of the navigation unit 70 (image display unit) via the connector group 700 (external output terminals).

Figure 23:
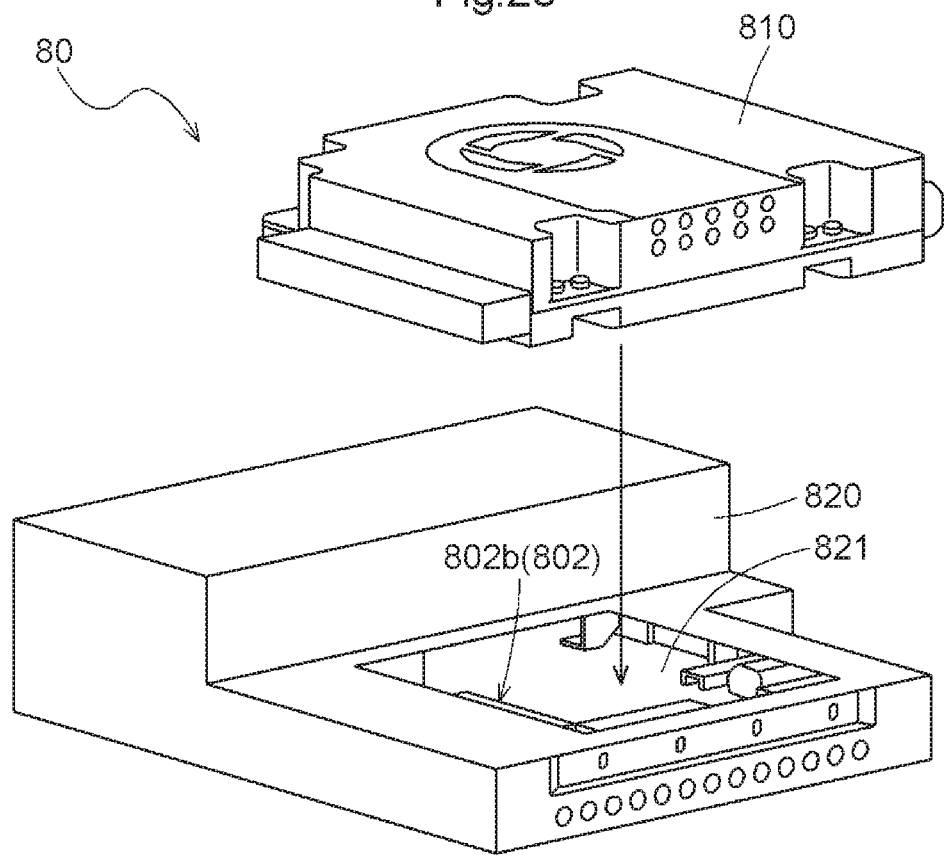
FIG. 23 is an exploded perspective view of the multimedia unit.
Figure 24:
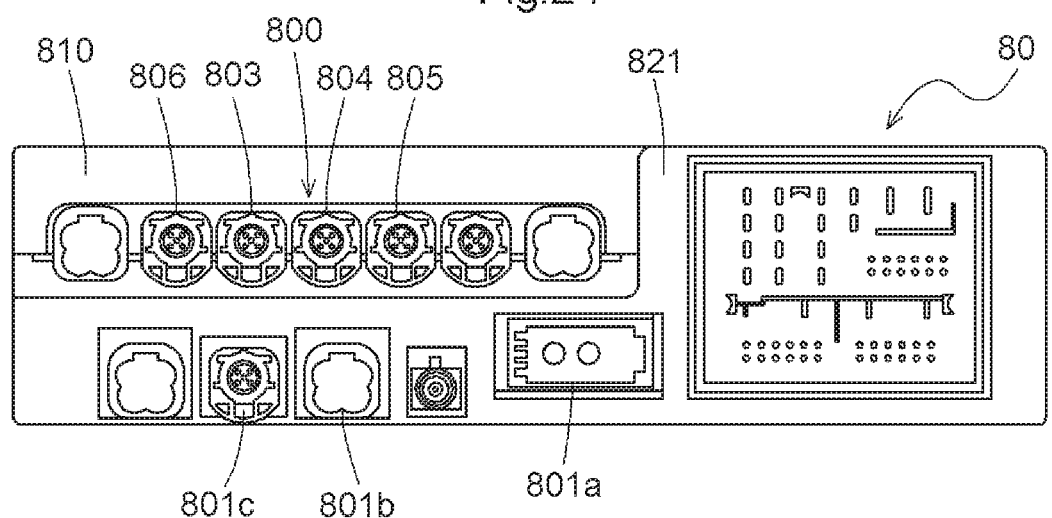
FIG. 24 is a rear view of the navigation unit.
Figure 25:
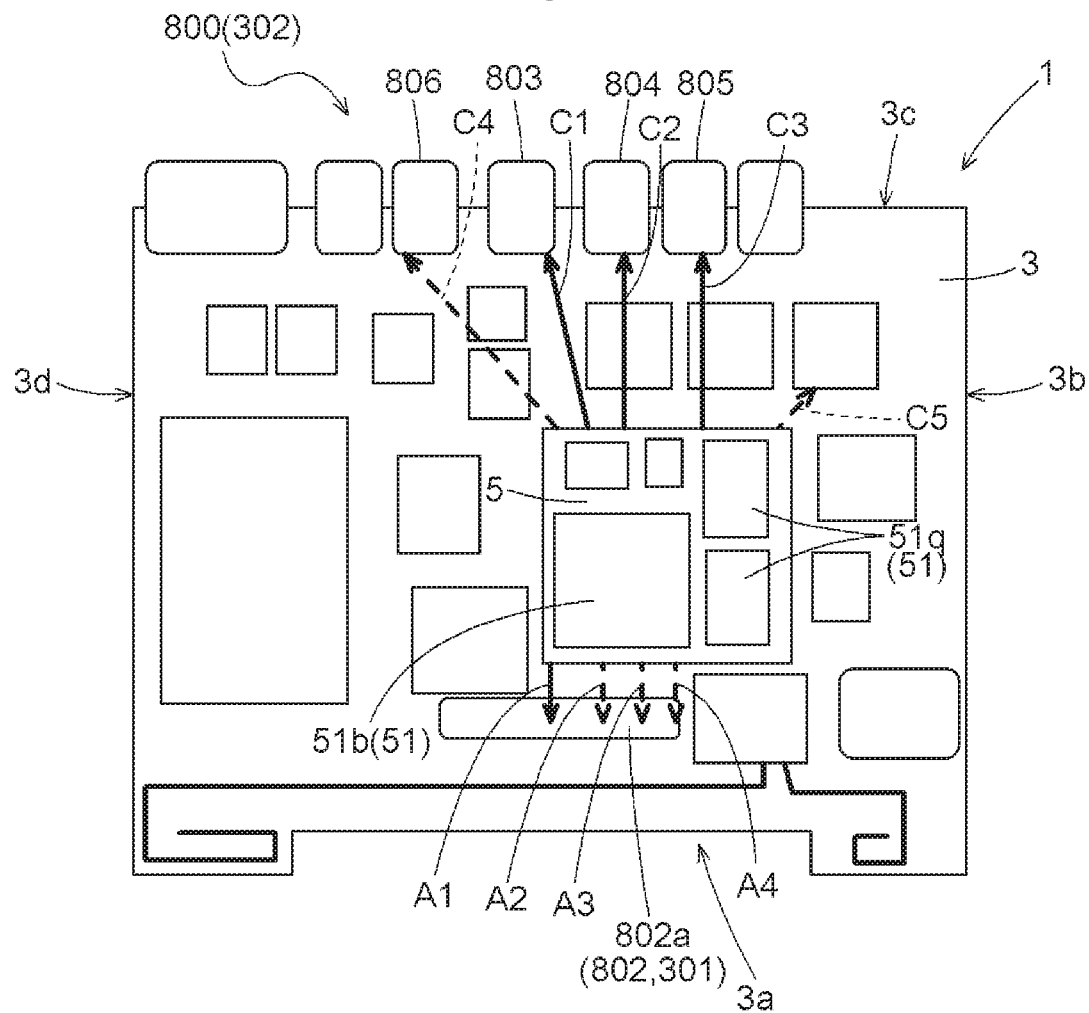
FIG. 25 is a view showing the layout of a main substrate that is mounted on the navigation unit and signal flows

FIGS. 22 to 25 show a multimedia unit 80 (image display unit) on which the semiconductor device 1 is mounted. The multimedia unit 80 is accommodated in, e.g., the lower part of a vehicle seat or the lower part of a trunk room (cargo room). The multimedia unit 80 includes a navigation unit 810 and an audio unit 820. The semiconductor device 1 shown in FIG. 25 is accommodated in the navigation unit 810. As shown in FIG. 24, the navigation unit 810 includes a connector group 800.

The semiconductor device 1 in the navigation unit 810 and the audio unit 820 are connected by a connection connector 802. As shown in FIG. 23, the connection connector 802 of the audio unit 820 is shown by reference character "802b." As shown in FIG. 25, the connection connector 802 of the navigation unit 810 (the semiconductor device 1) is shown by reference character "802a." As shown in FIG. 24, the audio unit 820 includes a display connector 801a (including also 801b and 801c). The display connector 801a transmits image output signals to the front-seat monitor device 71, and the connectors 801b, 801c transmit communication interface signals of PCIe, USB, etc. to the front-seat monitor device 71.

Like FIG. 21, FIG. 25 schematically shows the main substrate 3 on which the semiconductor module 5 is mounted. Thick solid arrows and thick dashed arrows in FIG. 25 also schematically show the direction of wiring from the semiconductor module 5 to the substrate terminal groups (301, 302) of the main substrate 3. The surface wiring patterns (311, 312) are formed in the surface wiring layer 30a of the main substrate 3 so as to extend substantially along these arrows.

As shown in FIG. 25, terminals corresponding to the image output (A1) to the front-seat monitor device 71 and the communication interfaces (A2, A3, A4) such as PCIe and USB are provided on the side of the semiconductor module 5 which faces the substrate first side 3a (the connection connector 802 side) of the main substrate 3 when the semiconductor module 5 is mounted on the main substrate 3. In the present embodiment, these signals are transmitted through the connection connector 802 to a sub-substrate 821 (another substrate) accommodated in the audio unit 820, and are transmitted to the front-seat monitor device 71 through the display connector 801a (and 801b, 801c) mounted on the sub-substrate 821. Of the connection connector 802, the connector "802a" in the main substrate 3 corresponds to the first substrate terminal group 301.

Terminal groups corresponding to image outputs (C1, C2, C3) to a meter display, a center display, etc. and a communication interface (C4) complying with the LVDS standard are provided on the side of the semiconductor module 5 which faces a different side from the substrate first side 3a, namely in this example, on the side of the semiconductor module 5 which faces the substrate second side 3c (the connector group 800 side) of the main substrate 3, i.e., the opposite side from the substrate first side 3a. These terminal groups are connected to devices different from the multimedia unit 80 via the connectors (803, 804, 805, 806). The connector group 800 corresponds to the second substrate terminal group 302. A terminal group corresponding to the interface (C5) with the LTE module for mobile phone communication which is mounted on the main substrate 3 is provided on the side of the semiconductor module 5 which faces the substrate second side 3c.

As described above, the first module terminal group 11 and the second module terminal group 12 are module terminal groups having the image output function. The first substrate terminal group 301 and the second substrate terminal group 302 are substrate terminal groups that are connected to the image display device. The main substrate 3 is provided in the multimedia unit 80 (image display unit). One of the first substrate terminal group 301 and the second substrate terminal group 302 (in the above example, the first substrate terminal group 301) is connected to the front-seat monitor device 71 (first display device) provided independently of the multimedia unit 80 (image display unit) via the display connectors (first external output terminal: 801a, 801b, 801c) provided in the multimedia unit 80 (image display unit). The other of the first substrate terminal group 301 and the second substrate terminal group 302 (in the above example, the second substrate terminal group 302) is connected to an image display device (second display device such as the meter display, the center display, or the rear-seat monitor device 72) provided independently of both the multimedia unit 80 (image display unit) and the front-seat monitor device 71 (first display device) via the connector group 800 (second external output terminals) provided in the multimedia unit 80 (image display unit). The multimedia unit 80 (image display unit) includes at least one substrate (sub-substrate 821) different from the main substrate 3. One of the first substrate terminal group 301 and the second substrate terminal group 302 (in the above example, the first substrate terminal group 301) is connected to the image display device (in the above example, the front-seat monitor device 71 (first display device) via this different substrate (sub-substrate 821).

Unlike the examples shown in FIGS. 22 to 25, one (first substrate terminal group 301) of the first substrate terminal group 301 and the second substrate terminal group 302 may be connected to the front-seat monitor device 71 (first display unit) via the connector group 800 (second external output terminals) provided in the multimedia unit 80 (image display unit). In this case, the other (second substrate terminal group 302) of the first substrate terminal group 301 and the second substrate terminal group 302 may be connected to an image display device (second display device such as the meter display, the center display, or the rear-seat monitor device 72) provided independently of both the multimedia unit 80 (image display unit) and the front-seat monitor device 71 (first display device) via the display connectors 801a, 801b, 801c (first external output terminals) provided in the multimedia unit 80 (image display unit).

Summary of Embodiment

A brief summary of the semiconductor device (1) and the semiconductor module (5) described above will be provided below.

In one aspect, a semiconductor device (1) includes: a semiconductor module (5) including a rectangular plate-like support substrate (21) that supports and fixes at least one semiconductor element (51) on an upper surface (21a) of the support substrate (21), and a plurality of connection terminals (10) that are arranged planarly along a lower surface (21b) of the support substrate (21) and that are electrically connected to the semiconductor element (51); and a main substrate (3) that has a plurality of wiring layers (30a, 30b, 30c, 30z) and that has the semiconductor module (5) surface-mounted thereon via the plurality of connection terminals (10). The plurality of connection terminals (10) are arranged in a plurality of rectangular rings along each side of the support substrate (21), and include a first module terminal group (11) and a second module terminal group (12) which are terminal groups having one of an image output function and a communication interface function. The first module terminal group (11) is located on a module first side (2a) that is one side of the support substrate (21). The second module terminal group (12) is located on a module second side (2c) that is an opposite side from the module first side (2a). The main substrate (3) includes a first substrate terminal group (301) and a second substrate terminal group (302) which are connected to one of an image display device (71, 72) and a communication device (73, 74). The first substrate terminal group (301) is located on a substrate first side (3a) that is one side of the main substrate (3). The second substrate terminal group (302) is located on a substrate second side (3c) that is an opposite side from the substrate first side (3a). The semiconductor module (5) is surface-mounted on a surface wiring layer (30a) of the main substrate (3) so that the module first side (2a) is located closer to the substrate first side (3a) than the module second side (2c) and the module second side (2c) is located closer to the substrate second side (3c) than the module first side (2a). The first module terminal group (11) and the first substrate terminal group (301) are connected by a first surface wiring pattern (311) formed in the surface wiring layer (30a). The second module terminal group (12) and the second substrate terminal group (302) are connected by a second surface wiring pattern (312) formed in the surface wiring layer (30a).

In one aspect, in a semiconductor module (5) including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element, the connection terminals (10) include a first module terminal group (11) and a second module terminal group (12) which are terminal groups having one of an image output function and a communication interface function, and the first module terminal group (11) is located on a module first side (2a) that is one side of the support substrate (21), and the second module terminal group (12) is located on a module second side (2c) that is an opposite side from the module first side (2a).

With this configuration, the plurality of types of terminal groups having the image output function (or the plurality of types of terminal groups having the communication interface function) in the semiconductor module (5) are arranged according to the positions where circuits (including terminals such as a connector) corresponding to each function are located on the main substrate (3) on which the semiconductor module (5) is mounted. Accordingly, when the semiconductor module (5) is mounted on the main substrate (3), connection can be made by using the wiring patterns (the first surface wiring pattern (311), the second surface wiring pattern (312)) formed in the surface wiring layer (30a). As a result, the number of wiring patterns to be formed in an inner layer of the main substrate (3) can be reduced, which can restrain an increase in the number of layers of the main substrate (3). In the semiconductor module (5) itself as well, terminals are arranged in view of a circuit substrate on which the semiconductor module (5) is to be mounted, whereby the semiconductor module (5) can be mounted on the circuit substrate with improved mount efficiency. With the above configuration, it is possible to provide a semiconductor device having mounted thereon a semiconductor module, in which input and output terminals adapted for the environment in which the semiconductor module is to be used are arranged, and such a semiconductor module.

In one aspect, it is preferable that the semiconductor element (51) be a semiconductor chip (51b) that is a package having at least one semiconductor die enclosed therein, the semiconductor chip (51b) have a plurality of element terminals that are electrically connected to the support substrate (21), the plurality of element terminals include a first element terminal group (VO1 (FT1)) and a second element terminal group (VO2 (FT2)) which are terminal groups having one of the image output function and the communication interface function, the first element terminal group (VO1 (FT1)) and the second element terminal group (VO2 (FT2)) be located on a same side (50b (50d)) of the package, and the semiconductor module (5) be a multichip module (5M) in which the plurality of element terminals and the plurality of connection terminals (10) have been rearranged on the support substrate (21) so that at least the semiconductor chip (51b) is mounted on the support substrate (21), at least the first element terminal group (VO1 (FT1)) is connected to the first module terminal group (31 (33)), and the second element terminal group (VO2 (FT2)) is connected to the second module terminal group (32 (34)).

Terminal arrangement in a semiconductor chip (51M) is changed on the support substrate (21), whereby the semiconductor module (5) with appropriate terminal arrangement can be implemented.

In one preferred aspect, the first module terminal group (11) and the second module terminal group (12) are module terminal groups having the image output function, the first substrate terminal group (301) and the second substrate terminal group (302) are substrate terminal groups that are connected to the image display device, the main substrate (3) is provided in an image display unit (70) having a first display device (71) as the image display device, the first substrate terminal group (301) is connected to the first display device (71) in the image display unit (70), and the second substrate terminal group (302) is connected to an external output terminal (700) provided in the image display unit (70) and is connected via the external output terminal (700) to a second display device that is the image display device provided independently of the image display unit (70).

With this configuration, an image display unit (70) equipped with a display, which is accommodated in a middle part (console) of a dashboard, can be appropriately configured in, e.g., a vehicle.

In one preferred aspect, the first module terminal group (11) and the second module terminal group (12) are module terminal groups having the image output function, the first substrate terminal group (301) and the second substrate terminal group (302) are substrate terminal groups that are connected to the image display device, the main substrate (3) is provided in an image display unit (80), one of the first substrate terminal group (301) and the second substrate terminal group (302) is connected via a first external output terminal (801) provided in the image display unit (80) to a first display device (71) that is the image display device provided independently of the image display unit (80), the other of the first substrate terminal group (301) and the second substrate terminal group (302) is connected via a second external output terminal (800) provided in the image display unit (80) to a second display device that is the image display device provided independently of the image display unit (80) and the first display device (71), and the image display unit (80) includes at least one substrate (821) different from the main substrate (3), and one of the first substrate terminal group (301) and the second substrate terminal group (302) is connected to the image display device via the different substrate (821).

With this configuration, an image display unit (80) with a separate display can be appropriately configured in, e.g., a vehicle.

It is preferable that the first display device (71) be a display that is mounted on a dashboard of a vehicle, and the second display device be a sub-display that is mounted on a meter panel of the vehicle or a center display that is mounted on the dashboard and displays operational information of an in-vehicle device.

With this configuration, a single image display unit (70, 80) can be appropriately connected to a plurality of display devices in, e.g., a vehicle, whereby an image display system can be configured efficiently.

In one aspect, it is preferable that the semiconductor module (5) further include a third module terminal group (13) that is a terminal group having one of the image output function and the communication interface function and that is a terminal group having a same function as the first module terminal group (11) and the second module terminal group (12), and the third module terminal group (13) be located on a module third side (2d) of the support substrate (21) which is different from the first side (2a) and the second side (2c).

With this configuration, the terminal groups having the same function (similar functions) are distributed on three of the four sides of the rectangular support substrate (21). This improves flexibility in arrangement of peripheral devices that are connected to the semiconductor module (5) and the semiconductor module (5) and also improves efficiency of wiring between the semiconductor module (5) and each peripheral device.

DESCRIPTION OF THE REFERENCE NUMERALS

- 1: Semiconductor Device
- 2a: Module First Side
- 2c: Module Second Side
- 2b, 2d: Module Third Side
- 3: Main Substrate
- 3a: Substrate First Side
- 3c: Substrate Second Side
- 5: Semiconductor Module
- 5M: Multichip Module
- 10: Terminal (Connection Terminal)
- 11: First Module Terminal Group
- 12: Second Module Terminal Group
- 13: Third Module Terminal Group
- 21: Support Substrate
- 21a: Upper Surface
- 21b: Lower Surface
- 30a: Surface Wiring Layer
- 31: First Image Output Terminal Group (First Module Terminal Group)
- 32: Second Image Output Terminal Group (Second Module Terminal Group)
- 33: First High-Speed Communication Interface Terminal Group (First Module Terminal Group)
- 34: Second High-Speed Communication Interface Terminal Group (Second Module Terminal Group)
- 35: Third High-Speed Communication Interface Terminal Group (Third Module Terminal Group)
- 51: Semiconductor Device
- 70: Navigation Unit (Image Display Unit)
- 71: Front-Seat Monitor Device (Image Display Device, First Display Unit)
- 80: Multimedia Unit (Image Display Unit)
- 301: First Substrate Terminal Group
- 302: Second Substrate Terminal Group
- 311: First Surface Wiring Pattern
- 312: Second Surface Wiring Pattern
- 821: Sub-Substrate

The invention claimed is:

1. A semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element, wherein the connection terminals include a first module terminal group and a second module terminal group which are terminal groups having one of an image output function and a communication interface function, and the first module terminal group is located on a module first side that is one side of the support substrate, and the second module terminal group is located on a module second side that is an opposite side from the module first side, wherein the semiconductor element is a semiconductor chip that is a rectangular package having at least one semiconductor die enclosed therein, the semiconductor chip has a plurality of element terminals that are electrically connected to the support substrate, the plurality of element terminals include a first element terminal group and a second element terminal group which are terminal groups having one of the image output function and the communication interface function, the first element terminal group and the second element terminal group are located on a same side of the package, and the semiconductor module is a multichip module in which the plurality of element terminals and the plurality of connection terminals have been rearranged on the support substrate so that at least the semiconductor chip is mounted on the support substrate, at least the first element terminal group is connected to the first module terminal group, and the second element terminal group is connected to the second module terminal group.

2. A semiconductor device, comprising:

a semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element; and a main substrate that has a plurality of wiring layers and that has the semiconductor module surface-mounted thereon via the plurality of connection terminals, wherein the plurality of connection terminals are arranged in a plurality of rectangular rings along each side of the support substrate, and include a first module terminal group and a second module terminal group which are terminal groups having one of an image output function and a communication interface function, the first module terminal group is located on a module first side that is one side of the support substrate, the second module terminal group is located on a module second side that is an opposite side from the module first side, the main substrate includes a first substrate terminal group and a second substrate terminal group which are connected to one of an image display device and a communication device, the first substrate terminal group is located on a substrate first side that is one side of the main substrate, the second substrate terminal group is located on a substrate second side that is an opposite side from the substrate first side, the semiconductor module is surface-mounted on a surface wiring layer of the main substrate so that the module first side is located closer to the substrate first side than the module second side and the module second side is located closer to the substrate second side than the module first side, and the first module terminal group and the first substrate terminal group are connected by a first surface wiring pattern formed in the surface wiring layer, and the second module terminal group and the second substrate terminal group are connected by a second surface wiring pattern formed in the surface wiring layer, wherein the semiconductor element is a semiconductor chip that is a rectangular package having at least one semiconductor die enclosed therein, the semiconductor chip has a plurality of element terminals that are electrically connected to the support substrate, the plurality of element terminals include a first element terminal group and a second element terminal group which are terminal groups having one of the image output function and the communication interface function, the first element terminal group and the second element terminal group are located on a same side of the package, and the semiconductor module is a multichip module in which the plurality of element terminals and the plurality of connection terminals have been rearranged on the support substrate so that at least the semiconductor chip is mounted on the support substrate, at least the first element terminal group is connected to the first module terminal group, and the second element terminal group is connected to the second module terminal group.

3. A semiconductor device, comprising:

a housing;

a semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element; and a main substrate that has a plurality of wiring layers and that has the semiconductor module surface-mounted thereon via the plurality of connection terminals, wherein the plurality of connection terminals are arranged in a plurality of rectangular rings along each side of the support substrate, and include a first module terminal group and a second module terminal group which are terminal groups having one of an image output function and a communication interface function, the first module terminal group is located on a module first side that is one side of the support substrate, the second module terminal group is located on a module second side that is an opposite side from the module first side, the main substrate includes a first connector and a second connector which are connected to one of an image display device and a communication device, the first connector is located on a substrate first side that is one side of the main substrate, the second connector is located on a substrate second side that is an opposite side from the substrate first side, the semiconductor module is surface-mounted on a surface wiring layer of the main substrate so that the module first side is located closer to the substrate first side than the module second side and the module second side is located closer to the substrate second side than the module first side, and the first module terminal group and the first connector are connected by a first surface wiring pattern formed in the surface wiring layer, and the second module terminal group and the second connector are connected by a second surface wiring pattern formed in the surface wiring layer, wherein the housing accommodates the main substrate and the first connector is configured to project outside of the housing.

4. The semiconductor device according to claim 3, wherein the semiconductor element is a semiconductor chip that is a rectangular package having at least one semiconductor die enclosed therein, the semiconductor chip has a plurality of element terminals that are electrically connected to the support substrate, the plurality of element terminals include a first element terminal group and a second element terminal group which are terminal groups having one of the image output function and the communication interface function, the first element terminal group and the second element terminal group are located on a same side of the package, and the semiconductor module is a multichip module in which the plurality of element terminals and the plurality of connection terminals have been rearranged on the support substrate so that at least the semiconductor chip is mounted on the support substrate, at least the first element terminal group is connected to the first module terminal group, and the second element terminal group is connected to the second module terminal group.

5. The semiconductor device according to claim 3, wherein the first module terminal group and the second module terminal group are module terminal groups having the image output function, the first connector and the second connector are connectors that are connected to an image display device, the main substrate is provided in an image display unit having a first display device as the image display device, the first connector is connected to the first display device in the image display unit, and the second connector is connected to an external output terminal provided in the image display unit and is connected via the external output terminal to a second display device that is an image display device provided independently of the image display unit.

6. The semiconductor device according to claim 3, wherein
the first module terminal group and the second module terminal group are module terminal groups having the image output function,
the first connector and the second connector are connectors that are connected to an image display device,
the main substrate is provided in an image display unit,
one of the first connector and the second connector is connected via a first external output terminal provided in the image display unit to a first display device that is an image display device provided independently of the image display unit,
the other of the first connector and the second connector is connected via a second external output terminal provided in the image display unit to a second display device that is the image display device provided independently of the image display unit and the first display device, and
the image display unit includes at least one substrate different from the main substrate, and one of the first connector and the second connector is connected to the image display device via the different substrate.

7. The semiconductor device according to claim 5, wherein
the first display device is a display that is mounted on a dashboard of a vehicle, and
the second display device is a sub-display that is mounted on a meter panel of the vehicle or a center display that is mounted on the dashboard and displays operational information of an in-vehicle device.

8. The semiconductor device according to claim 3, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

9. The semiconductor device according to claim 4, wherein
the first module terminal group and the second module terminal group are module terminal groups having the image output function,
the first connector and the second connector are connectors that are connected to an image display device,
the main substrate is provided in an image display unit having a first display device as the image display device,
the first connector is connected to the first display device in the image display unit, and
the second connector is connected to an external output terminal provided in the image display unit and is connected via the external output terminal to a second display device that is an image display device provided independently of the image display unit.

10. The semiconductor device according to claim 4, wherein
the first module terminal group and the second module terminal group are module terminal groups having the image output function,
the first connector and the second connector are connectors that are connected to an image display device,
the main substrate is provided in an image display unit,
one of the first connector and the second connector is connected via a first external output terminal provided in the image display unit to a first display device that is the image display device provided independently of the image display unit,
the other of the first connector and the second connector is connected via a second external output terminal provided in the image display unit to a second display device that is an image display device provided independently of the image display unit and the first display device, and
the image display unit includes at least one substrate different from the main substrate, and one of the first connector and the second connector is connected to the image display device via the different substrate.

11. The semiconductor device according to claim 9, wherein
the first display device is a display that is mounted on a dashboard of a vehicle, and
the second display device is a sub-display that is mounted on a meter panel of the vehicle or a center display that is mounted on the dashboard and displays operational information of an in-vehicle device.

12. The semiconductor device according to claim 4, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

13. The semiconductor device according to claim 5, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

14. The semiconductor device according to claim 6, wherein
the first display device is a display that is mounted on a dashboard of a vehicle, and
the second display device is a sub-display that is mounted on a meter panel of the vehicle or a center display that is mounted on the dashboard and displays operational information of an in-vehicle device.

15. The semiconductor device according to claim 6, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

16. The semiconductor device according to claim 10, wherein
the first display device is a display that is mounted on a dashboard of a vehicle, and
the second display device is a sub-display that is mounted on a meter panel of the vehicle or a center display that is mounted on the dashboard and displays operational information of an in-vehicle device.

17. The semiconductor device according to claim 11, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

18. The semiconductor device according to claim 9, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

19. The semiconductor device according to claim 16, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

20. The semiconductor device according to claim 10, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

21. A semiconductor device, comprising:
an image display device having a navigation unit and an audio unit;
a semiconductor module including a rectangular plate-like support substrate that supports and fixes at least one semiconductor element on an upper surface of the support substrate, and a plurality of connection terminals that are arranged planarly along a lower surface of the support substrate and that are electrically connected to the semiconductor element; and
a main substrate that has a plurality of wiring layers and that has the semiconductor module surface-mounted thereon via the plurality of connection terminals, wherein
the plurality of connection terminals are arranged in a plurality of rectangular rings along each side of the support substrate, and include a first module terminal group and a second module terminal group which are terminal groups having one of an image output function and a communication interface function,
the first module terminal group is located on a module first side that is one side of the support substrate,
the second module terminal group is located on a module second side that is an opposite side from the module first side,
the main substrate includes a first connector and a second connector which are connected to one of an image display device and a communication device,
the first connector is located on a substrate first side that is one side of the main substrate,
the second connector is located on a substrate second side that is an opposite side from the substrate first side,
the semiconductor module is surface-mounted on a surface wiring layer of the main substrate so that the module first side is located closer to the substrate first side than the module second side and the module second side is located closer to the substrate second side than the module first side, and
the first module terminal group and the first connector are connected by a first surface wiring pattern formed in the surface wiring layer, and the second module terminal group and the second connector are connected by a second surface wiring pattern formed in the surface wiring layer,
wherein the navigation unit accommodates the main substrate, and the navigation unit and the audio unit are connected by a connector of the audio unit and the first connector.

22. The semiconductor device according to claim 21, wherein
the semiconductor element is a semiconductor chip that is a rectangular package having at least one semiconductor die enclosed therein,
the semiconductor chip has a plurality of element terminals that are electrically connected to the support substrate,
the plurality of element terminals include a first element terminal group and a second element terminal group which are terminal groups having one of the image output function and the communication interface function,
the first element terminal group and the second element terminal group are located on a same side of the package, and
the semiconductor module is a multichip module in which the plurality of element terminals and the plurality of connection terminals have been rearranged on the support substrate so that at least the semiconductor chip is mounted on the support substrate, at least the first element terminal group is connected to the first module terminal group, and the second element terminal group is connected to the second module terminal group.

23. The semiconductor device according to claim 21, wherein
the first module terminal group and the second module terminal group are module terminal groups having the image output function,
the first connector and the second connector are connectors that are connected to an image display device, the main substrate is provided in an image display unit having a first display device as the image display device, the first connector is connected to the first display device in the image display unit, and the second connector is connected to an external output terminal provided in the image display unit and is connected via the external output terminal to a second display device that is an image display device provided independently of the image display unit.

24. The semiconductor device according to claim 21, wherein the first module terminal group and the second module terminal group are module terminal groups having the image output function, the first connector and the second connector are connectors that are connected to an image display device, the main substrate is provided in an image display unit, one of the first connector and the second connector is connected via a first external output terminal provided in the image display unit to a first display device that is an image display device provided independently of the image display unit, the other of the first connector and the second connector is connected via a second external output terminal provided in the image display unit to a second display device that is the image display device provided independently of the image display unit and the first display device, and the image display unit includes at least one substrate different from the main substrate, and one of the first connector and the second connector is connected to the image display device via the different substrate.

25. The semiconductor device according to claim 23, wherein the first display device is a display that is mounted on a dashboard of a vehicle, and the second display device is a sub-display that is mounted on a meter panel of the vehicle or a center display that is mounted on the dashboard and displays operational information of an in-vehicle device.

26. The semiconductor device according to claim 21, wherein the semiconductor module further includes a third module terminal group that is a terminal group having one of the image output function and the communication interface function and that is a terminal group having a same function as the first module terminal group and the second module terminal group, and the third module terminal group is located on a module third side of the support substrate which is different from the module first side and the module second side.

27. The semiconductor device according to claim 22, wherein the first module terminal group and the second module terminal group are module terminal groups having the image output function, the first connector and the second connector are connectors that are connected to an image display device, the main substrate is provided in an image display unit having a first display device as the image display device, the first connector is connected to the first display device in the image display unit, and the second connector is connected to an external output terminal provided in the image display unit and is connected via the external output terminal to a second display device that is an image display device provided independently of the image display unit.

28. The semiconductor device according to claim 22, wherein the first module terminal group and the second module terminal group are module terminal groups having the image output function, the first connector and the second connector are connectors that are connected to an image display device, the main substrate is provided in an image display unit, one of the first connector and the second connector is connected via a first external output terminal provided in the image display unit to a first display device that is the image display device provided independently of the image display unit, the other of the first connector and the second connector is connected via a second external output terminal provided in the image display unit to a second display device that is an image display device provided independently of the image display unit and the first display device, and the image display unit includes at least one substrate different from the main substrate, and one of the first connector and the second connector is connected to the image display device via the different substrate.

29. The semiconductor device according to claim 27, wherein the first display device is a display that is mounted on a dashboard of a vehicle, and the second display device is a sub-display that is mounted on a meter panel of the vehicle or a center display that is mounted on the dashboard and displays operational information of an in-vehicle device.

30. The semiconductor device according to claim 22, wherein the semiconductor module further includes a third module terminal group that is a terminal group having one of the image output function and the communication interface function and that is a terminal group having a same function as the first module terminal group and the second module terminal group, and the third module terminal group is located on a module third side of the support substrate which is different from the module first side and the module second side.

31. The semiconductor device according to claim 23, wherein the semiconductor module further includes a third module terminal group that is a terminal group having one of the image output function and the communication interface function and that is a terminal group having a same function as the first module terminal group and the second module terminal group, and the third module terminal group is located on a module third side of the support substrate which is different from the module first side and the module second side.

32. The semiconductor device according to claim 24, wherein the first display device is a display that is mounted on a dashboard of a vehicle, and the second display device is a sub-display that is mounted on a meter panel of the vehicle or a center display that is mounted on the dashboard and displays operational information of an in-vehicle device.

33. The semiconductor device according to claim 24, wherein the semiconductor module further includes a third module terminal group that is a terminal group having one of the image output function and the communication interface function and that is a terminal group having a same function as the first module terminal group and the second module terminal group, and the third module terminal group is located on a module third side of the support substrate which is different from the module first side and the module second side.

34. The semiconductor device according to claim 28, wherein
the first display device is a display that is mounted on a dashboard of a vehicle, and
the second display device is a sub-display that is mounted on a meter panel of the vehicle or a center display that is mounted on the dashboard and displays operational information of an in-vehicle device.

35. The semiconductor device according to claim 29, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

36. The semiconductor device according to claim 27, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

37. The semiconductor device according to claim 34, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

38. The semiconductor device according to claim 28, wherein
the semiconductor module further includes a third module terminal group that is a terminal group having one of the image output function and the communication interface function and that is a terminal group having a same function as the first module terminal group and the second module terminal group, and
the third module terminal group is located on a module third side of the support substrate which is different from the module first side and the module second side.

* * * * *